US012776759B2

(12) United States Patent
Goto et al.

(10) Patent No.: US 12,776,759 B2
(45) Date of Patent: Oct. 27, 2026

(54) MULTILAYER PIEZOELECTRIC SUBSTRATE ACOUSTIC DEVICE WITH INTERDIGITAL TRANSDUCER ELECTRODE FORMED AT LEAST PARTIALLY IN A PIEZOELECTRIC LAYER

(71) Applicant: Skyworks Solutions, Inc., Irvine, CA (US)

(72) Inventors: Rei Goto, Osaka (JP); Hironori Fukuhara, Ibaraki (JP); Shoji Okamoto, Hirakata (JP)

(73) Assignee: Skyworks Solutions, Inc., Irvine, CA (US)

( * ) Notice: Subject to any disclaimer, the term of this patent is extended or adjusted under 35 U.S.C. 154(b) by 113 days.

(21) Appl. No.: 18/429,799

(22) Filed: Feb. 1, 2024

(65) Prior Publication Data

US 2024/0178812 A1 May 30, 2024

Related U.S. Application Data

(63) Continuation-in-part of application No. 18/229,590, filed on Aug. 2, 2023.

(60) Provisional application No. 63/394,813, filed on Aug. 3, 2022.

(51) Int. Cl.
*H03H 9/02* (2006.01)
*H03H 9/64* (2006.01)
*H10N 30/853* (2023.01)

(52) U.S. Cl.
CPC .... *H03H 9/02574* (2013.01); *H03H 9/02834* (2013.01); *H03H 9/6483* (2013.01); *H10N 30/8542* (2023.02)

(58) Field of Classification Search
CPC .......... H03H 9/02574; H03H 9/02834; H03H 9/6483
See application file for complete search history.

(56) References Cited

U.S. PATENT DOCUMENTS

| | | | |
|---|---|---|---|
| 6,268,680 | B1 | 7/2001 | Rooth |
| 6,642,813 | B1 | 11/2003 | Itakura et al. |
| 6,848,295 | B2 | 2/2005 | Auner et al. |

(Continued)

FOREIGN PATENT DOCUMENTS

| | | |
|---|---|---|
| JP | H07283682 | 10/1995 |
| JP | 2013-214789 | 10/2013 |

(Continued)

OTHER PUBLICATIONS

International Search Report for International Application No. PCT/JP2020/014906, dated Jun. 23, 2020.

(Continued)

*Primary Examiner* — Samuel S Outten
(74) *Attorney, Agent, or Firm* — VIA LLP

(57) ABSTRACT

A surface acoustic wave device is disclosed. The surface acoustic wave device can include a multilayer piezoelectric substrate having a support substrate and a piezoelectric layer over the support substrate and an interdigital transducer electrode formed at least partially in the piezoelectric layer. The interdigital transducer electrode has a first layer and a second layer including different materials. The first layer includes a material that has a mass density greater than or equal to a mass density of molybdenum.

20 Claims, 16 Drawing Sheets

(56) References Cited

U.S. PATENT DOCUMENTS

| | | | | |
|---|---|---|---|---|
| 7,322,243 | B2 | 1/2008 | Liu et al. | |
| 8,143,681 | B2 | 3/2012 | Zaghloul et al. | |
| 8,427,032 | B2 | 4/2013 | Nishiyama et al. | |
| 8,436,509 | B1 | 5/2013 | Branch | |
| 9,160,299 | B2 | 10/2015 | Goto et al. | |
| 9,257,960 | B2 | 2/2016 | Ruile et al. | |
| 9,673,779 | B2 | 6/2017 | Ruile et al. | |
| 9,906,206 | B2 | 2/2018 | Shih et al. | |
| 11,082,029 | B2 | 8/2021 | Kodama et al. | |
| 2006/0032312 | A1 | 2/2006 | Auner et al. | |
| 2011/0133600 | A1* | 6/2011 | Kimura | H03H 9/14541 310/313 B |
| 2012/0133246 | A1 | 5/2012 | Yaoi et al. | |
| 2013/0300253 | A1* | 11/2013 | Kimura | H03H 9/02818 310/313 A |
| 2014/0266511 | A1 | 9/2014 | Turner et al. | |
| 2015/0318838 | A1 | 11/2015 | Bhattacharjee et al. | |
| 2017/0155373 | A1 | 6/2017 | Ruby et al. | |
| 2019/0097602 | A1 | 3/2019 | Kimura | |
| 2019/0334500 | A1* | 10/2019 | Horikawa | H03H 9/02574 |
| 2020/0119710 | A1 | 4/2020 | Kadota et al. | |
| 2020/0212876 | A1 | 7/2020 | Goto et al. | |
| 2020/0328728 | A1* | 10/2020 | Nakagawa | H04B 1/0057 |
| 2022/0200566 | A1 | 6/2022 | Kadota et al. | |
| 2024/0048125 | A1 | 2/2024 | Goto et al. | |
| 2024/0178814 | A1 | 5/2024 | Goto et al. | |

FOREIGN PATENT DOCUMENTS

| | | |
|---|---|---|
| WO | WO 2001/028090 | 4/2001 |
| WO | WO 2010/016192 | 2/2010 |
| WO | WO 2011/007690 | 1/2011 |
| WO | WO 2012/086441 | 6/2012 |
| WO | WO 2014/054580 A1 | 4/2014 |

OTHER PUBLICATIONS

Translation of the International Search Report for International Application No. PCT/JP2020/014906, dated Jun. 23, 2020.

Kimura et al., "High Q SAW Resonator Using upper-electrodes on Grooved-electrodes in LiTaO3," IEEE MTT-S, International Microwave Symposium digest, Jun. 2020, pp. 1740-1743.

* cited by examiner $d_{embed}/\lambda = 0.00$: $h_{AL}/\lambda = 0.08 - h_{Mo}/\lambda = 0.01$ — 42°XY ··········
$d_{embed}/\lambda = 0.06$: $h_{AL}/\lambda = 0.08 - h_{Mo}/\lambda = 0.04$ — 42°XY — — — —
$d_{embed}/\lambda = 0.12$: $h_{AL}/\lambda = 0.08 - h_{Mo}/\lambda = 0.04$ — 42°XY —·—·—·— w/o buried $h_{al} = 0.05L$, $h_{mo} = 0.05L$ $h_{WT} = 0.02L$, $h_{WB} = 0.02L$ } $h_{al} = 0.04L$ $h_{WT} = 0.02L$, $h_{WB} = 0.04L$ $h_{WT} = 0.02L$, $h_{WB} = 0.06L$ w/o buried $h_{al}$ = 0.05L, $h_{mo}$ = 0.05L $h_{WT}$ = 0.02L, $h_{WB}$ = 0.02L $h_{WT}$ = 0.02L, $h_{WB}$ = 0.04L $h_{WT}$ = 0.02L, $h_{WB}$ = 0.06L } $h_{al}$ = 0.04L

MULTILAYER PIEZOELECTRIC SUBSTRATE ACOUSTIC DEVICE WITH INTERDIGITAL TRANSDUCER ELECTRODE FORMED AT LEAST PARTIALLY IN A PIEZOELECTRIC LAYER

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/394,813, filed Aug. 3, 2022, titled "MULTI LAYER PIEZOELECTRIC SUBSTRATE WITH EMBEDDED INTERDIGITAL TRANSDUCER," and U.S. patent application Ser. No. 18/229,590, filed Aug. 2, 2023, titled "RADIO FREQUENCY ACOUSTIC DEVICES AND METHODS WITH INTERDIGITAL TRANSDUCER FORMED IN MULTILAYER PIEZOELECTRIC SUBSTRATE," are hereby incorporated by reference under 37 CFR 1.57.

BACKGROUND

Field

Embodiments of this disclosure relate to surface acoustic wave (SAW) devices, and in particular to multilayer piezoelectric substrate (MPS) SAW devices with an interdigital transducer (IDT) electrode at least partially positioned in a piezoelectric layer.

Description of the Related Technology

An acoustic wave device can include a plurality of resonators arranged to filter a radio frequency signal. Example acoustic wave resonators include surface acoustic wave (SAW) resonators and bulk acoustic wave (BAW) resonators. A surface acoustic wave resonator can include an interdigital transducer (IDT) electrode on a piezoelectric substrate. The surface acoustic wave resonator can generate a surface acoustic wave on a surface of the piezoelectric layer on which the interdigital transducer electrode is disposed.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, three acoustic wave filters can be arranged as a triplexer. As another example, four acoustic wave filters can be arranged as a quadplexer.

Multilayer piezoelectric substrate (MPS) packaging methods are developing to provide for high Q, high coupling coefficient $$k_{eff}^2,$$

small temperature coefficient of frequency (TCF) and high power durability filter solutions.

SUMMARY

In some aspects, the techniques described herein relate to a surface acoustic wave device including: a multilayer piezoelectric substrate having a support substrate and a piezoelectric layer over the support substrate; and an interdigital transducer electrode formed at least partially in the piezoelectric layer, the interdigital transducer electrode having a first layer and a second layer including different materials, the first layer including a material that has a mass density greater than or equal to a mass density of molybdenum.

In some embodiments, the techniques described herein relate to a surface acoustic wave device wherein the piezoelectric layer includes lithium tantalate.

In some embodiments, the techniques described herein relate to a surface acoustic wave device wherein the piezoelectric layer is a 40±30° Y-cut X-propagation lithium tantalate layer.

In some embodiments, the techniques described herein relate to a surface acoustic wave device wherein the first layer includes tungsten.

In some embodiments, the techniques described herein relate to a surface acoustic wave device wherein the second layer includes aluminum.

In some embodiments, the techniques described herein relate to a surface acoustic wave device wherein the first layer is partially positioned in the piezoelectric layer and the first layer is positioned over the piezoelectric layer.

In some embodiments, the techniques described herein relate to a surface acoustic wave device wherein the first layer is completely positioned in the piezoelectric layer and the first layer is positioned over the piezoelectric layer.

In some embodiments, the techniques described herein relate to a surface acoustic wave device wherein the first layer is completely positioned in the piezoelectric layer and the first layer is partially positioned in the piezoelectric layer and partially positioned over the piezoelectric layer.

In some embodiments, the techniques described herein relate to a surface acoustic wave device wherein a depth of the interdigital transducer electrode positioned in the piezoelectric layer is in a range between 0.02 L and 0.08 L.

In some embodiments, the techniques described herein relate to a surface acoustic wave device wherein a thickness of the first layer is in a range between 0.02 L and 0.08 L.

In some aspects, the techniques described herein relate to a surface acoustic wave device including: a multilayer piezoelectric substrate having a support substrate and a piezoelectric layer over the support substrate, the piezoelectric layer having a first surface facing the support substrate and a second surface opposite the first surface; and an interdigital transducer electrode at least partially positioned between the first and second surfaces of the piezoelectric layer, the interdigital transducer electrode having a first layer and a second layer including different materials, the first layer including a material that has a mass density greater than 10 grams per cubic centimeter.

In some embodiments, the techniques described herein relate to a surface acoustic wave device wherein the piezoelectric layer is a 40±30° Y-cut X-propagation lithium tantalate layer.

In some embodiments, the techniques described herein relate to a surface acoustic wave device wherein the first layer includes tungsten.

In some embodiments, the techniques described herein relate to a surface acoustic wave device wherein the second layer includes aluminum.

In some embodiments, the techniques described herein relate to a surface acoustic wave device wherein the first layer is partially positioned in the piezoelectric layer and the first layer is positioned over the piezoelectric layer.

In some embodiments, the techniques described herein relate to a surface acoustic wave device wherein the first layer is completely positioned in the piezoelectric layer and the first layer is positioned over the piezoelectric layer.

In some aspects, the techniques described herein relate to a surface acoustic wave device including: a multilayer piezoelectric substrate having a support substrate and a piezoelectric layer over the support substrate, the piezoelectric layer having a cavity; and an interdigital transducer electrode at least partially positioned in the cavity, the interdigital transducer electrode having a first layer and a second layer including different materials, the first layer including a material that has a mass density greater than or equal to a mass density of molybdenum.

In some embodiments, the techniques described herein relate to a surface acoustic wave device wherein the piezoelectric layer is a 40±30° Y-cut X-propagation lithium tantalate layer.

In some embodiments, the techniques described herein relate to a surface acoustic wave device wherein the first layer includes tungsten.

In some embodiments, the techniques described herein relate to a surface acoustic wave device wherein the second layer includes aluminum.

In some aspects, the techniques described herein relate to a surface acoustic wave device including: a multilayer piezoelectric substrate having a support substrate and a piezoelectric layer over the support substrate, the piezoelectric layer having a first surface facing the support substrate and a second surface opposite the first surface; and an interdigital transducer electrode having a first portion and a second portion, the first portion positioned below the first surface of the piezoelectric layer and the second portion positioned above the first surface, the first portion having a first sidewall and a second portion having a second sidewall angled relative to the first sidewall.

In some embodiments, the techniques described herein relate to a surface acoustic wave device wherein the piezoelectric layer is a 40±30° Y-cut X-propagation lithium tantalate layer.

In some embodiments, the techniques described herein relate to a surface acoustic wave device wherein the first sidewall and the second sidewall are angled by an angle in a range between 5 degrees and 60 degrees.

In some embodiments, the techniques described herein relate to a surface acoustic wave device wherein the first portion has a width wider than the second portion at the surface of the piezoelectric layer.

In some embodiments, the techniques described herein relate to a surface acoustic wave device wherein the first portion has a width narrower than the second portion at the surface of the piezoelectric layer.

In some embodiments, the techniques described herein relate to a surface acoustic wave device wherein the first portion includes a first material and the second portion includes a second material different from the first material.

In some embodiments, the techniques described herein relate to a surface acoustic wave device wherein the first material is tungsten, molybdenum, platinum, or gold and the second material is aluminum.

In some embodiments, the techniques described herein relate to a surface acoustic wave device wherein the first sidewall and the second sidewall are laterally offset by a gap.

In some embodiments, the techniques described herein relate to a surface acoustic wave device wherein a depth of the interdigital transducer electrode positioned in the piezoelectric layer is in a range between 0.02 L and 0.08 L.

In some aspects, the techniques described herein relate to a surface acoustic wave device including: a multilayer piezoelectric substrate having a support substrate and a piezoelectric layer over the support substrate, the piezoelectric layer having a first surface facing the support substrate and a second surface opposite the first surface; and an interdigital transducer electrode having a first portion and a second portion, the first portion positioned below the first surface of the piezoelectric layer and the second portion positioned above the first surface, the first portion having a first sidewall and a second portion having a second sidewall laterally offset from the first sidewall.

In some embodiments, the techniques described herein relate to a surface acoustic wave device wherein the piezoelectric layer is a 40±30° Y-cut X-propagation lithium tantalate layer.

In some embodiments, the techniques described herein relate to a surface acoustic wave device wherein the first sidewall and the second sidewall are angled by an angle in a range between 5 degrees and 60 degrees.

In some embodiments, the techniques described herein relate to a surface acoustic wave device wherein the first portion has a width wider than the second portion at the surface of the piezoelectric layer.

In some embodiments, the techniques described herein relate to a surface acoustic wave device wherein the first portion has a width narrower than the second portion at the surface of the piezoelectric layer.

In some embodiments, the techniques described herein relate to a surface acoustic wave device wherein the first portion includes a first material and the second portion includes a second material different from the first material.

In some embodiments, the techniques described herein relate to a surface acoustic wave device wherein the first material is tungsten, molybdenum, platinum, or gold and the second material is aluminum.

In some embodiments, the techniques described herein relate to a surface acoustic wave device wherein a depth of the interdigital transducer electrode positioned in the piezoelectric layer is in a range between 0.02 L and 0.08 L.

In some aspects, the techniques described herein relate to a surface acoustic wave device including: a multilayer piezoelectric substrate having a support substrate and a piezoelectric layer over the support substrate, the piezoelectric layer having a first surface facing the support substrate and a second surface opposite the first surface; and an interdigital transducer electrode having a first layer and a second layer including different materials, at least a portion of the first layer being positioned in the piezoelectric layer, the first layer having a first sidewall and a second layer having a second sidewall angled relative to the first sidewall.

In some embodiments, the techniques described herein relate to a surface acoustic wave device wherein the piezoelectric layer is a 40±30° Y-cut X-propagation lithium tantalate layer.

In some embodiments, the techniques described herein relate to a surface acoustic wave device wherein the first sidewall and the second sidewall are angled by an angle in a range between 5 degrees and 60 degrees.

The present disclosure relates to U.S. Patent Application Ser. No. 18/229,590, titled "RADIO FREQUENCY ACOUSTIC DEVICES AND METHODS WITH INTERDIGITAL TRANSDUCER FORMED IN MULTILAYER PIEZOELECTRIC SUBSTRATE," filed on even date herewith, the entire disclosure of which is hereby incorporated by reference herein.

BRIEF DESCRIPTION OF THE DRAWINGS

FIG. 2A' is an enlarged view of the encircled portion of the IDT shown in FIG. 2A.

FIG. 2B' is an enlarged view of the encircled portion of the IDT shown in FIG. 2B.

FIG. 2C' is an enlarged view of the encircled portion of the IDT shown in FIG. 2C.

Figure 2A:
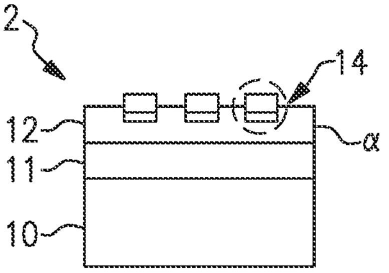
FIG. 2A is a cross sectional view of an IDT structure of a section of a SAW device with an IDT structure formed with a piezoelectric layer according to an embodiment.
Figure 2A:
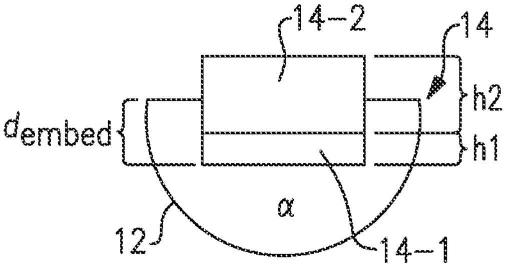

(middle frame), and resonance frequency fs (right frame) versus embedment depth $d_{embed}/\lambda$ for different heights $h_{Mo}$ of a Mo layer in the range $0.02 \le h_{mo}/\lambda \le 0.08$, fixed height $h_{Ai}$ of an Al layer at $h_{Al}/\lambda=0.08$, and fixed LT cut angle for XY-$LiTaO_3$ at 42°, as obtained from a 2D simulation for the IDT structure presented in FIG. 2A and FIG. 2A'.

Figure 3A:
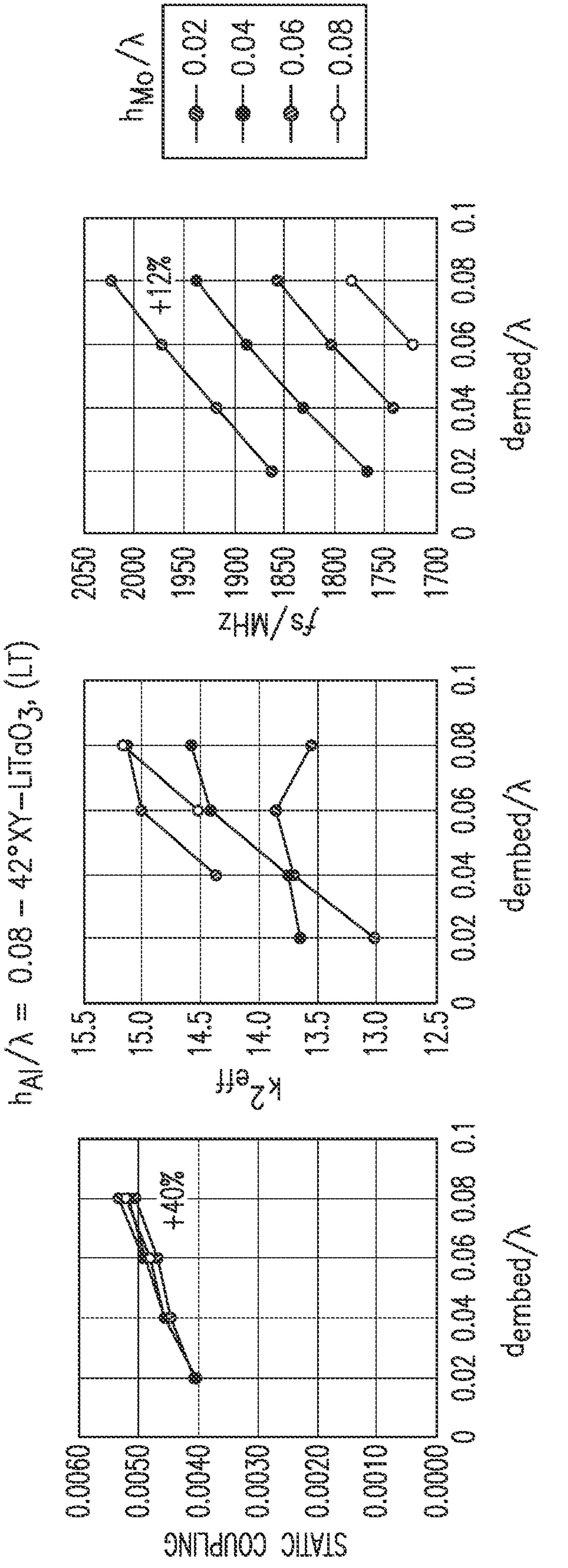
FIG. 3A illustrates three plots of static coupling (left frame), $$k_{eff}^2$$
Figure 3B:
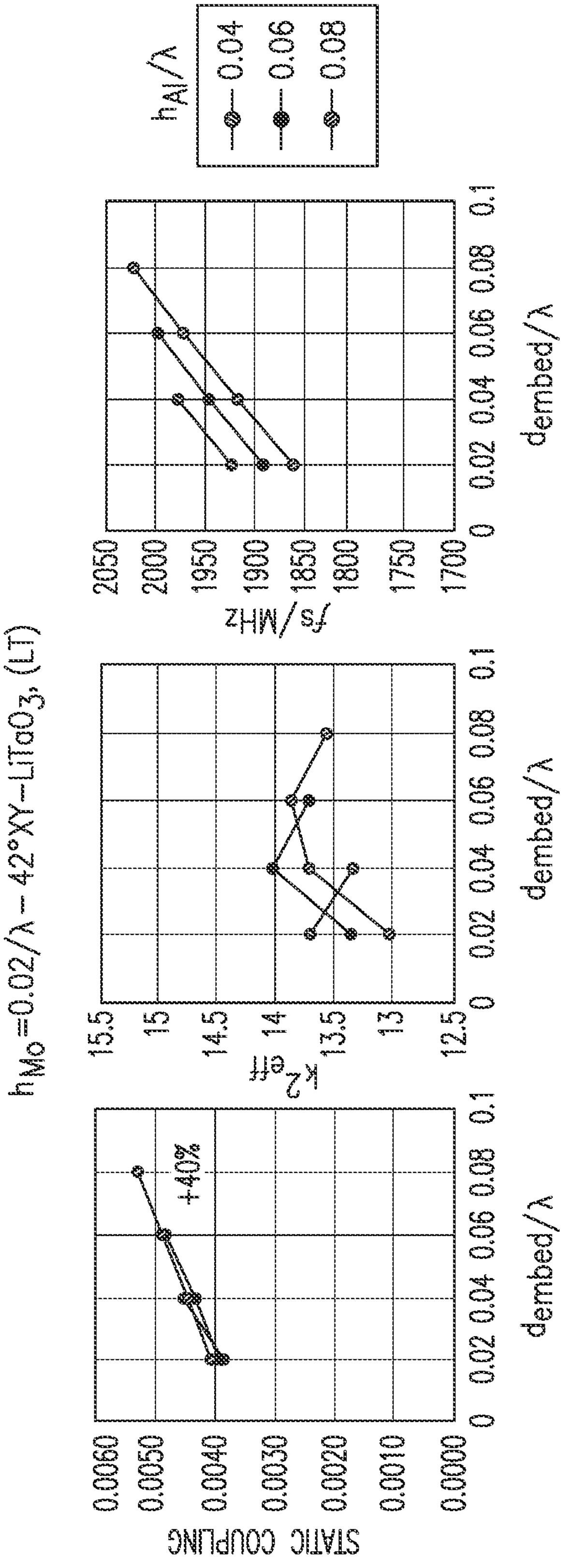

FIG. 3B illustrates three plots of static coupling (left frame), $$k_{eff}^2$$

(middle frame), and resonance frequency $f_s$ (right frame) versus embedment depth $d_{embed}/\lambda$ for different heights $h_{Al}$ of an Al layer in the range $0.04 \le h_{Al}/\lambda \le 0.08$, a fixed height $h_{Mo}$ of a Mo layer at $h_{Mo}/\lambda=0.02$, and fixed LT cut angle for XY-$LiTaO_3$ at 42°, as obtained from a 2D simulation for the IDT structure presented in FIG. 2A and FIG. 2A'.

Figure 3C:
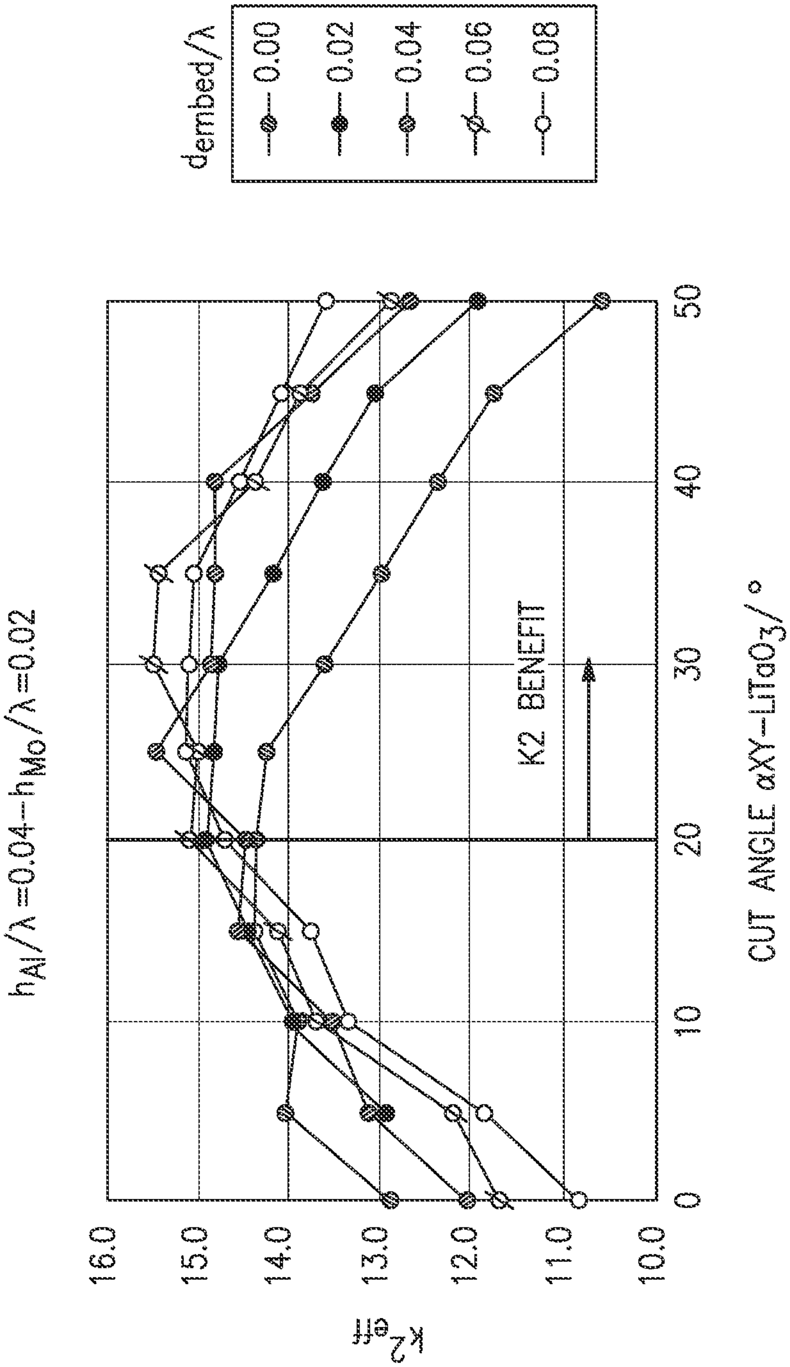

FIG. 3C illustrates a plot of $$k_{eff}^2$$

versus embedment the LT cut angle for XY-$LiTaO_3$ for different embedment depths $d_{embed}/\lambda$ in the range $0.00 \le d_{embed}/\lambda \le 0.08$, a fixed height $h_{Mo}$ of a Mo layer at $h_{Mo}/\lambda=0.02$, and a fixed height $h_{Al}$ of an Al layer at $h_{Al}/\lambda=0.04$, as obtained from a 2D simulation for the IDT structure presented in FIG. 2A and FIG. 2A'.

Figure 4A:
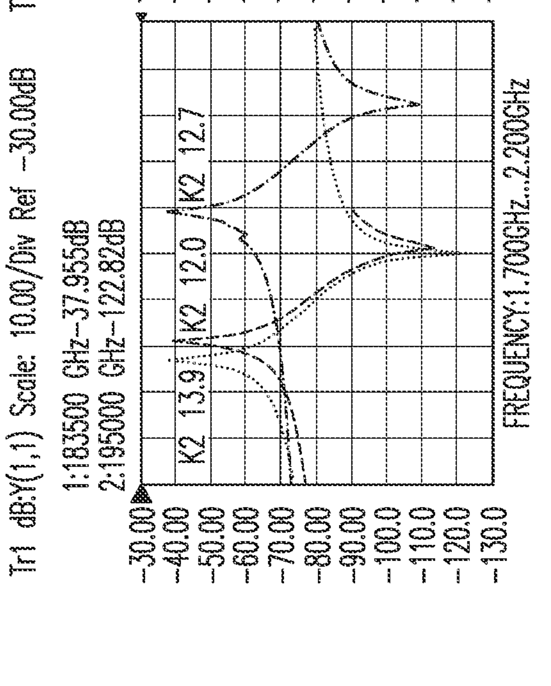

FIG. 4A is a plot of admittance Y(dB) versus frequency f (GHz) for IDT structures with different embedment depths $d_{embed}/\lambda$ as obtained from a 3D simulation for IDT structures in accordance with the structures shown in FIG. 2A and FIG. 2A'.

Figure 4B:
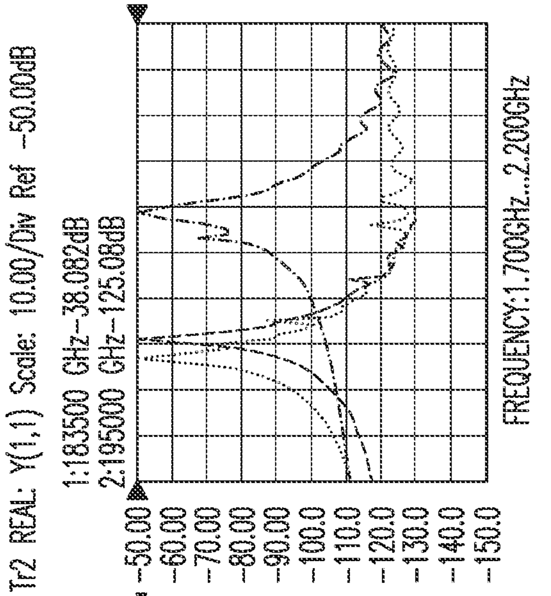

FIG. 4B is a plot of conduction G(dB) versus frequency f (GHz) for IDT structures with different embedment depths $d_{embed}/\lambda$ as obtained from a 3D simulation for IDT structures in accordance with the structures shown in FIG. 2A and FIG. 2A'.

Figure 4C:
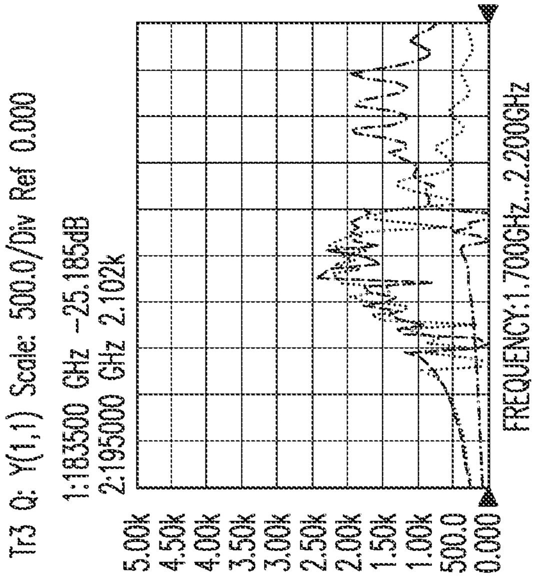

FIG. 4C is a plot of the Quality factor Q versus frequency f (GHz) for IDT structures with different embedment depths $d_{embed}/\lambda$ as obtained from a 3D simulation for IDT structures in accordance with the structures shown in FIG. 2A and FIG. 2A'.

Figure 5A:
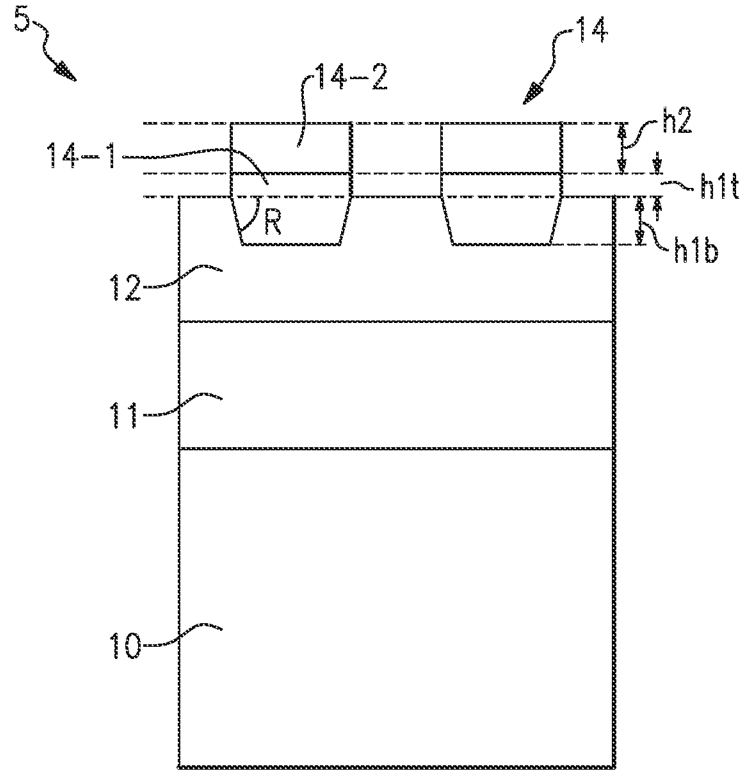

FIG. 5A is a schematic cross-sectional side view of a surface acoustic wave (SAW) device according to an embodiment.

Figure 5C:
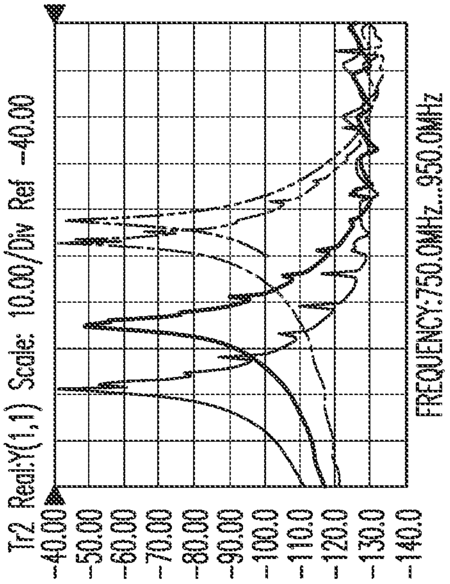
Figure 5B:
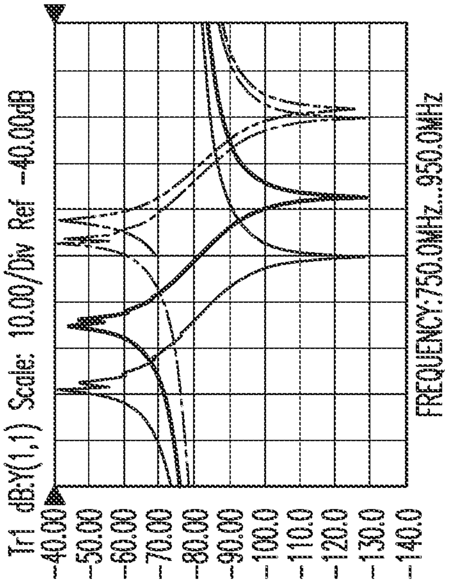
Figure 5D:
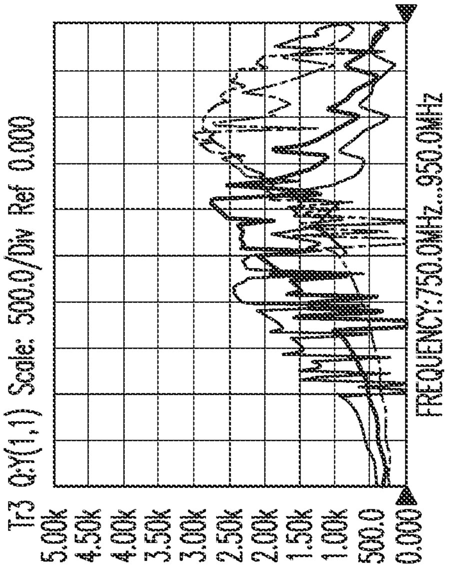

FIGS. 5B to 5D are graphs showing simulation results of four different SAW devices.

Figure 6A:
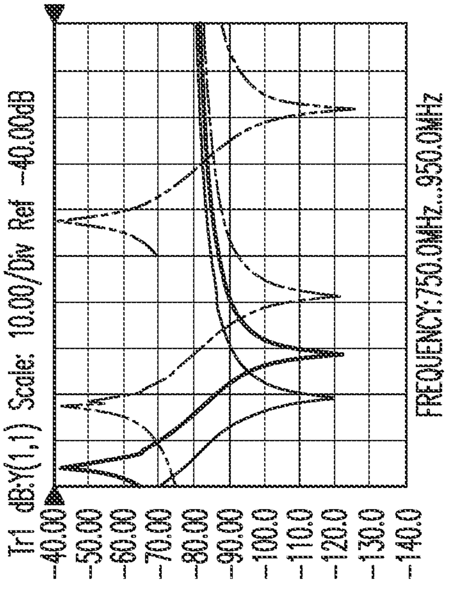
Figure 6B:
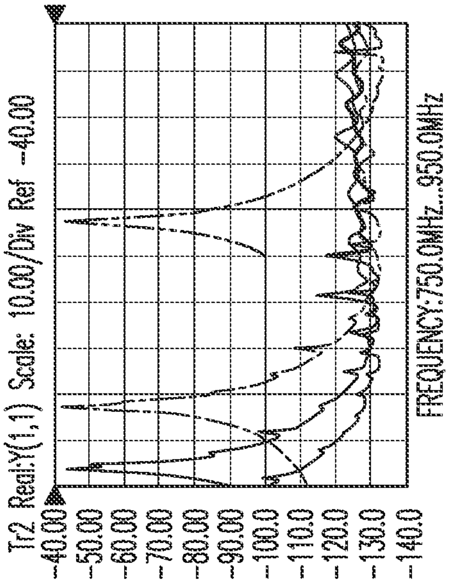
Figure 6C:
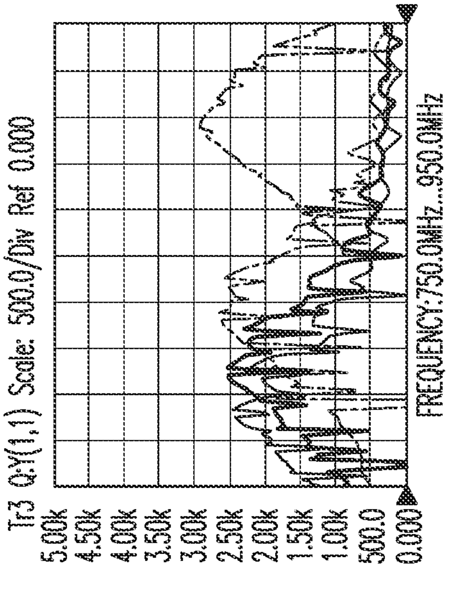

FIGS. 6A to 6C are graphs showing simulation results of four different SAW devices.

FIGS. 7A to 7D are schematic cross-sectional side views illustrating different shapes of an interdigital transducer (IDT) electrode.

Figure 8A:
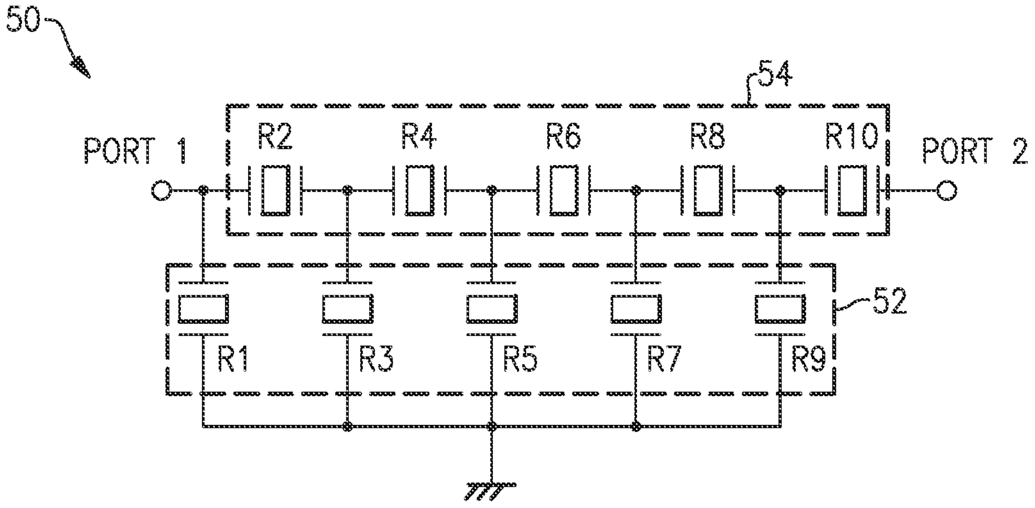

FIG. 8A is a schematic diagram of a ladder filter according to an embodiment.

Figure 8B:
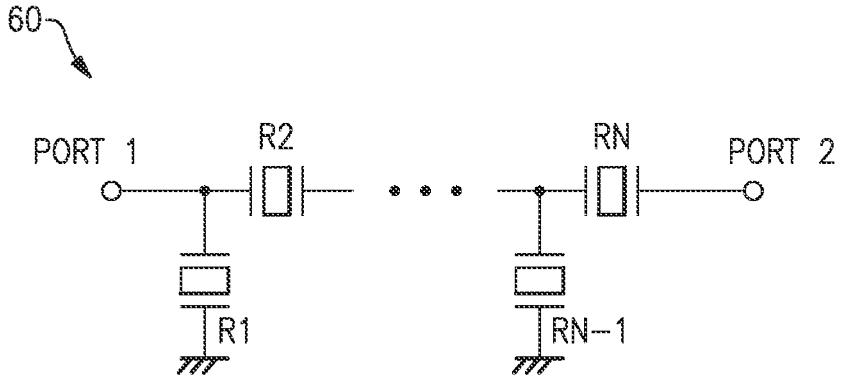

FIG. 8B is a schematic diagram of a ladder filter according to another embodiment.

Figure 9C:
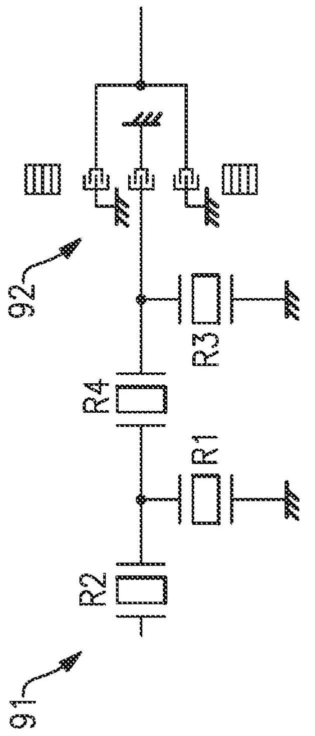
Figure 9A:
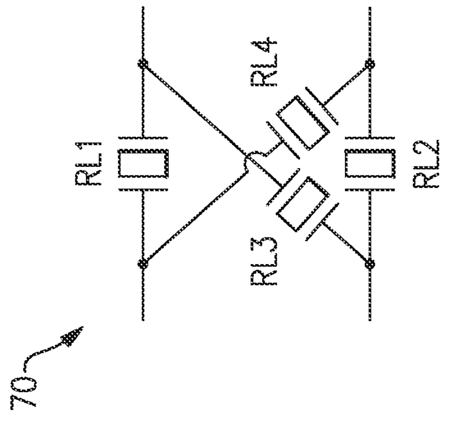

FIG. 9A is a schematic diagram of a lattice filter.

Figure 9B:
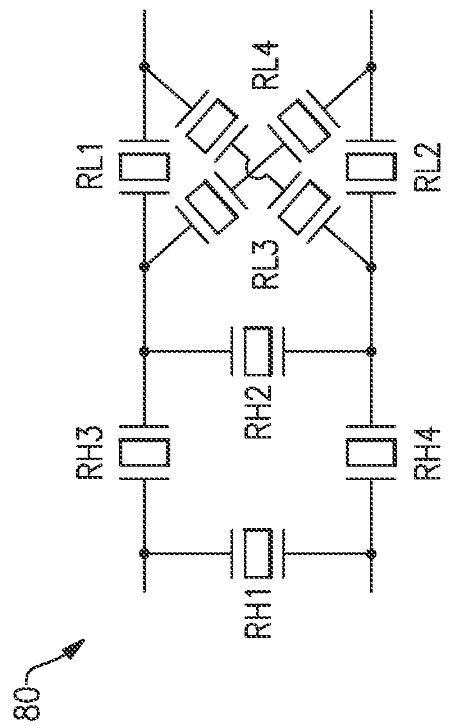

FIG. 9B is a schematic diagram of a hybrid ladder and lattice filter.

FIG. 9C is a schematic diagram of an acoustic filter that includes ladder stages and a multi-mode surface acoustic wave filter.

Figure 10A:
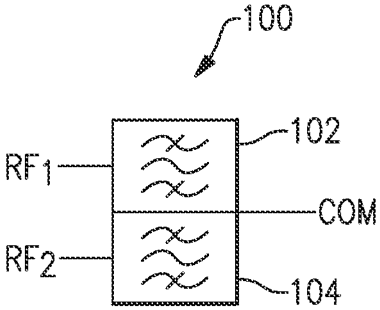

FIG. 10A is a schematic diagram of a duplexer that includes an acoustic wave filter according to an embodiment.

Figure 10B:
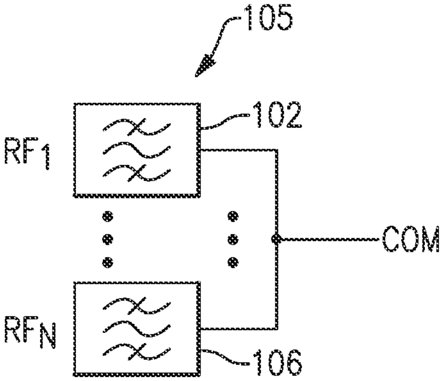

FIG. 10B is a schematic diagram of a multiplexer that includes an acoustic wave filter according to an embodiment.

Figure 11:
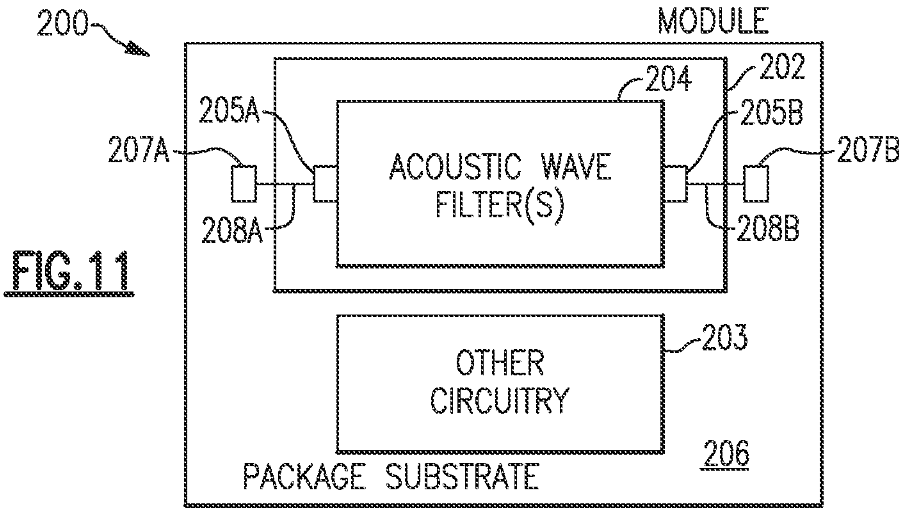

FIG. 11 is a schematic diagram of a radio frequency module that includes an acoustic wave filter according to an embodiment.

Figure 12:
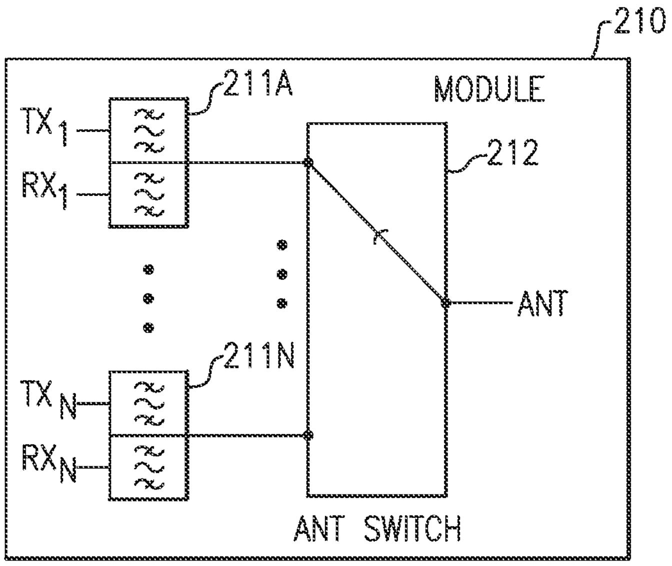

FIG. 12 is a schematic block diagram of a module that includes an antenna switch and duplexers according to an embodiment.

Figure 13:
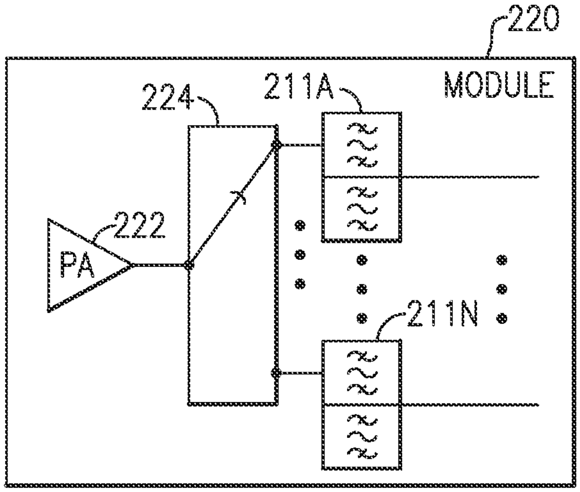

FIG. 13 is a schematic block diagram of a module that includes a power amplifier, a radio frequency switch, and duplexers according to an embodiment.

Figure 14:
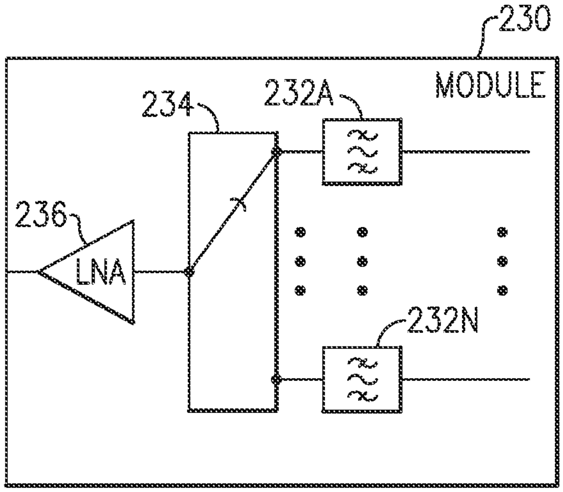

FIG. 14 is a schematic block diagram of a module that includes a low noise amplifier, a radio frequency switch, and filters according to an embodiment.

Figure 15:
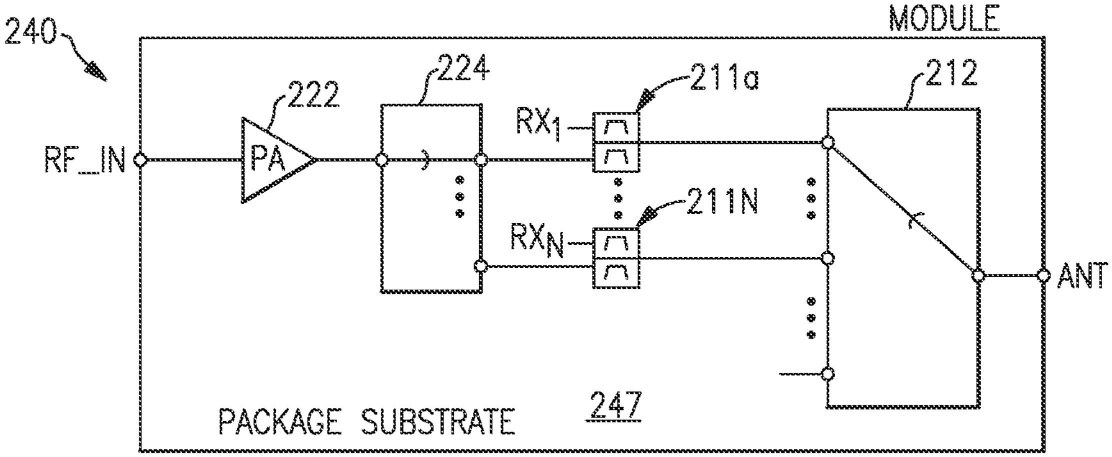

FIG. 15 is a schematic diagram of a radio frequency module that includes an acoustic wave filter according to an embodiment.

Figure 16A:
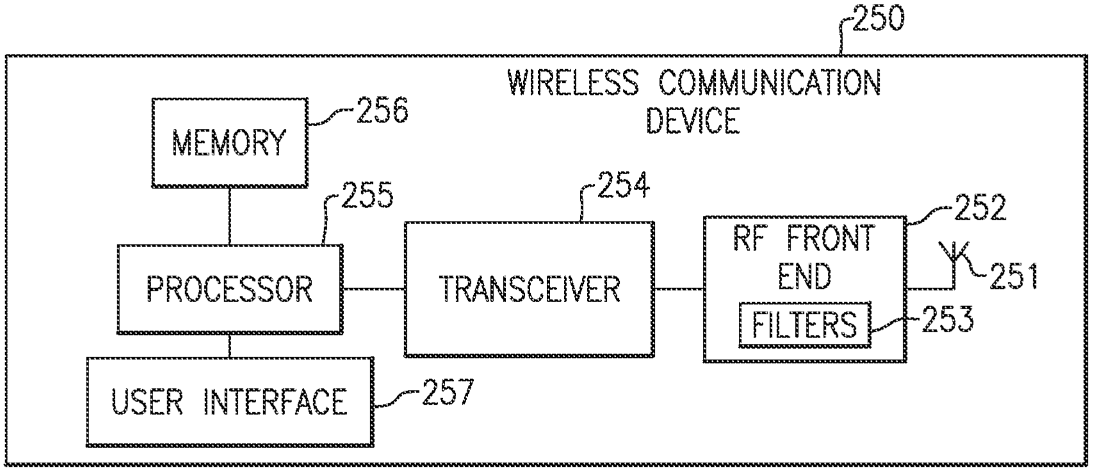

FIG. 16A is a schematic block diagram of a wireless communication device that includes an acoustic wave filter according to an embodiment.

Figure 16B:
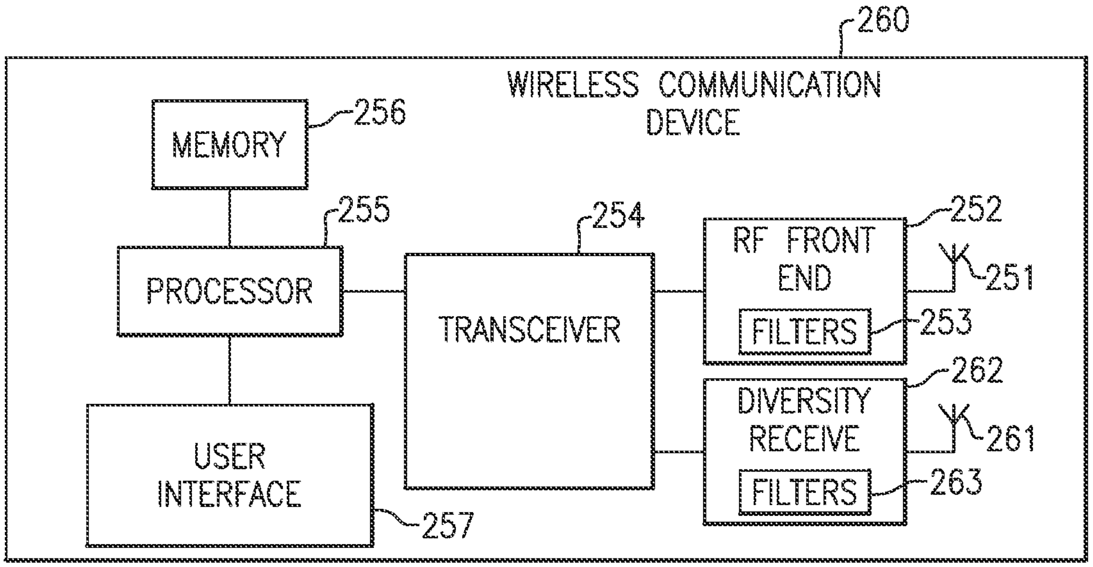

FIG. 16B is a schematic block diagram of another wireless communication device that includes an acoustic wave filter according to an embodiment.

DETAILED DESCRIPTION OF EMBODIMENTS

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic filters can implement bandpass filters. For example, a bandpass filter can include surface acoustic wave (SAW) devices. Multilayer piezoelectric substrate (MPS) surface acoustic wave (SAW) resonators and temperature compensated (TC) surface acoustic wave (SAW) resonators are examples of the SAW devices. As another example, a bandpass filter can include bulk acoustic wave (BAW) resonators, such as film bulk acoustic wave resonators (FBARs) and solidly mounted bulk acoustic wave resonators (SMRs).

In acoustic filter applications, insertion loss improvement can be significant for the performance of the filters. Insertion loss improvement can help achieve, for example, a receive chain with a desired noise figure. Insertion loss improvement can help with implementing a transmit chain with less power consumption and/or better power handling.

Typical lithium tantalate ($LiTaO_3$, LT) based multilayer piezoelectric substrate (MPS) surface acoustic wave (SAW) filter packages have an upper limit for coupling coefficient $$k_{eff}^2$$

of around 12%. This value is higher than the $$k_{eff}^2$$

of a 128° lithium niobate ($LiNbO_3$, LN) based MPS SAW filter package, which may have the $$k_{eff}^2$$

of about 10%. However, the $$k_{eff}^2$$

of around 12% may be still too small to obtain sufficient passband and good insertion loss. To obtain a $$k_{eff}^2$$

greater than 12%, a LN based MPS SAW filter package was proposed. Said LN based MPS had an attractive $$k_{eff}^2$$

greater than 15%. However, a relatively thick silicon dioxide ($SiO_2$) layer used to compensate for the TCF of the LN contributed to a limited Q performance due to $SiO_2$ mechanical loss.

To provide a solution with a high $$k_{eff}^2$$

and a high Q, LT based MPS SAW filter packages with an embedded interdigital transducer (IDT) structure are proposed herein. Size reduction due to a large static capacitance may be achieved by forming the IDT at least partially in a piezoelectric layer with a relatively high permittivity, such as LT. Q performance may be maintained without a relatively thick $SiO_2$.

Various embodiments disclosed herein relate to surface acoustic wave (SAW) devices with an interdigital transducer (IDT) electrode formed at least partially in a piezoelectric layer. A SAW device according to an embodiment can include a piezoelectric layer and an interdigital transducer (IDT) electrode formed with the piezoelectric layer. The IDT electrode can be formed with the piezoelectric layer such that the IDT electrode is at least partially in the piezoelectric layer. For example, the IDT electrode can be partially in the piezoelectric layer and partially over the piezoelectric layer, or be embedded completely within the piezoelectric layer. The piezoelectric layer can have a first surface and a second surface opposite the first surface. At least a portion of the IDT electrode can be positioned between the first surface and the second surface of the piezoelectric layer. The SAW device can be a multilayer piezoelectric substrate (MPS) SAW device that includes a support substrate. The first surface can face the support substrate.

While example SAW devices will now be discussed, the devices and methods disclosed herein, including those relating to FIGS. 2A-2C', 5A, and 7A-7D for example, can apply to other types of acoustic wave devices, including boundary wave devices and Lamb wave devices, for example.

Figure 1A:
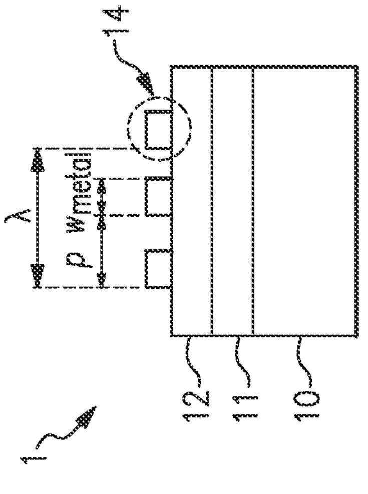
FIG. 1A is a cross sectional view of an interdigital transducer (IDT) structure of a section of a surface acoustic wave (SAW) device having an IDT structure arranged on a piezoelectric layer.

FIG. 1A is a cross sectional view of a surface acoustic wave (SAW) device 1. The SAW device 1 includes a support substrate 10, a functional layer 11 over the support substrate 10, a piezoelectric layer 12 over the functional layer 11, and an interdigital transducer (IDT) electrode 14 on the piezoelectric layer 12. The SAW device 1 is an example of a multilayer piezoelectric substrate (MPS) SAW device.

The piezoelectric layer 12 can be a lithium based piezoelectric layer. For example, the piezoelectric layer 12 can be a lithium tantalate (LT) layer or a lithium niobate (LN) layer.

The IDT electrode 14 is positioned over the piezoelectric layer 12. As illustrated, the IDT electrode 14 has a first side in physical contact with the piezoelectric layer 12 and a second side opposite the first side. The IDT electrode 14 can include aluminum (Al), molybdenum (Mo), tungsten (W), gold (Au), silver (Ag), copper (Cu), platinum (Pt), ruthenium (Ru), titanium (Ti), the like, or any suitable combination or alloy thereof. The IDT electrode 14 can be a multi-layer IDT electrode in some applications. A ratio of the IDT width ($W_{metal}$) the pitch (p) is usually defined as duty factor (DF) or metallization ratio ($w_{metal}/P$).

The functional layer can function as a temperature compensation (TC) layer. The TC layer can bring a temperature coefficient of frequency (TCF) of the SAW device closer to zero. The TC layer can have a positive TCF. This can compensate for a negative TCF of the piezoelectric layer 12. The piezoelectric layer 12 can be lithium niobate or lithium tantalate, which both have a negative TCF. The TC layer can be a dielectric film. The TC layer can be a silicon dioxide ($SiO_2$) layer. In some other embodiments, a different TC layer can be implemented. Some examples of other TC layers include a tellurium dioxide ($TeO_2$) layer or a silicon oxyfluoride (SiOF) layer.

Figure 1B:
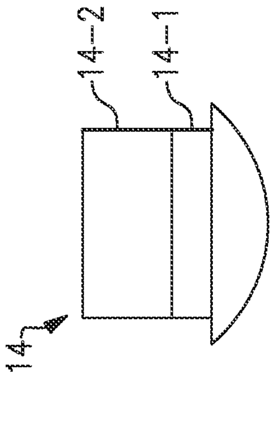
FIG. 1B is an enlarged view of the encircled portion of the IDT shown in FIG. 1A.

FIG. 1B is an enlarged view of the encircled portion of the IDT 14 shown in FIG. 1A. In the example shown in FIG. 1B, the IDT 14 has two layers, for instance a layer 14-1 of molybdenum (Mo), and a layer 14-2 of aluminum (Al). The IDT 14 as a whole is arranged on the piezoelectric layer 12.

Figure 1C:
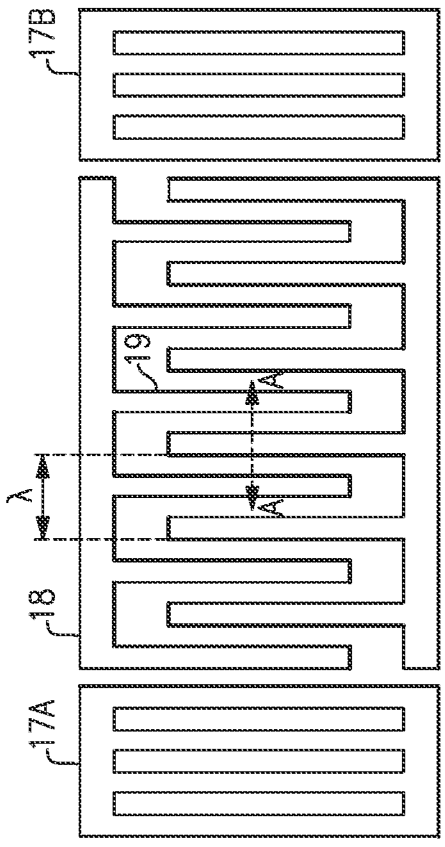
FIG. 1C is a top view of the SAW device of FIG. 1A.

FIG. 1C is a top view on the SAW device 1 of FIG. 1A. In FIG. 1C, the view of the SAW devices shown in FIG. 1A is along the dashed line from A to A. The IDT electrode 14 is positioned between a first acoustic reflector 17A and a second acoustic reflector 17B. The acoustic reflectors 17A and 17B are separated from the IDT electrode 14 by respective gaps. The IDT electrode 14 includes a bus bar 18 and IDT fingers 19 extending from the bus bar 18. The IDT fingers 19 have a pitch of $p=\lambda/2$, where A denotes the wavelength of the resonant frequency fs of the SAW device. The SAW device can include any suitable number of IDT fingers 19. The pitch of the IDT fingers 19 corresponds to the resonant frequency fs of the SAW device.

Figure 1D:
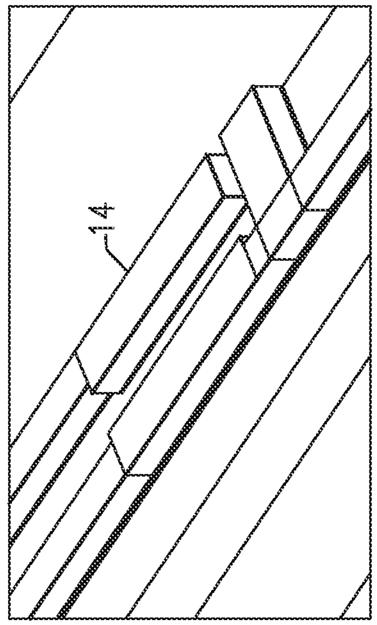
FIG. 1D is a perspective view of the SAW device shown in FIG. 1A.

FIG. 1D is a perspective view on a section of the IDT 14 of the SAW device 1. As shown in FIG. 1D, a piston mode may be implemented as a hammerhead at end portions of the IDT structure 14.

FIG. 2A is a cross sectional view of a surface acoustic wave (SAW) device 2 according to an embodiment. FIG. 2A' is an enlarged view of the encircled portion of the SAW device 2 shown in FIG. 2A. The SAW device 2 can include a support substrate 10, a functional layer 11, a piezoelectric layer 12, and an interdigital transducer electrode 14.

The support substrate 10 can be any suitable substrate layer, such as a silicon layer, a quartz layer, a ceramic layer, a glass layer, a spinel layer, a magnesium oxide spinel layer, a sapphire layer, a diamond layer, a silicon carbide layer, a silicon nitride layer, an aluminum nitride layer, or the like. The support substrate 10 can have a relatively high acoustic impedance. An acoustic impedance of the support substrate 10 can be higher than an acoustic impedance of the piezoelectric layer 12. For instance, the support substrate 10 can have a higher acoustic impedance than an acoustic impedance of lithium niobate and a higher acoustic impedance than lithium tantalate. The acoustic impedance of the support substrate 10 can be higher than an acoustic impedance of silicon dioxide ($SiO_2$). The SAW device 2 including the piezoelectric layer 12 on a support substrate 10 with relatively high thermal conductivity, such as silicon substrate, can achieve better thermal dissipation compared to a similar SAW resonator without the high impedance support substrate 10.

In some embodiments, the functional layer 11 can act as an adhesive layer. The functional layer 11 can include any suitable material. The functional layer 11 can be, for example, an oxide layer (e.g., a silicon dioxide ($SiO_2$) layer). In some embodiments, the functional layer 11 can be the trap rich layer. The trap rich layer can mitigate the parasitic surface conductivity of the support substrate 10. The trap rich layer can be formed in a number of ways, for example, by forming the surface of the support substrate 10 with amorphous or polycrystalline silicon, by forming the surface of the support substrate 10 with porous silicon, or by introducing defects into the surface of the support substrate 10 via ion implantation, ion milling, or other methods. In some embodiments, the trap rich layer can improve the electrical characteristics of the SAW device 2 by increasing the depth and sharpness on the anti-resonance peak.

The piezoelectric layer 12 can be a lithium tantalate (LT) layer. For example, the piezoelectric layer 12 can be an LT layer having a cut angle of 42° (42° Y-cut X-propagation LT) or a cut angle of 60° (60° Y-cut X-propagation LT). For example, the piezoelectric layer 12 can be 42±25° Y-cut LT, 42±20° Y-cut LT, 42±15° Y-cut LT, 42±10° Y-cut LT, 42±5° Y-cut LT, 60±20° Y-cut LT, 60±15° Y-cut LT, 60±10° Y-cut LT, or 60±5° Y-cut LT. The piezoelectric layer 12 may include aXY-LT where a denotes the LT cut angle in the range of $0° \leq a \leq 50°$. Any other suitable piezoelectric material, such as a lithium niobate (LN) layer, can be used as the piezoelectric layer 12. A thickness of the piezoelectric layer 12 can be selected based on a wavelength λ or L of a surface acoustic wave generated by the SAW device 2 in certain applications. The IDT electrode 14 has a pitch that sets the wavelength λ or L of the SAW device 2. The piezoelectric layer 12 can be sufficiently thick to avoid significant frequency variation.

The IDT electrode 14 can be formed with or positioned at least partially in (e.g., embedded or buried in) the piezoelectric layer 12. The illustrated IDT electrode 14 can include a first layer 14-1 and a second layer 14-2. In the SAW device 2, the IDT electrode 14 includes separate IDT layers (e.g., the first layer 14-1 and the second layer 14-2) that impact acoustic properties and electrical properties. Accordingly, in some embodiments, electrical properties, such as insertion loss, can be improved by adjusting one of the IDT layers without significantly impacting acoustic properties.

The first layer 14-1 of the IDT electrode 14 can be referred to as a lower electrode layer. The first layer 14-1 of the IDT electrode 14 is disposed between the second layer 14-2 of the IDT electrode 14 and the piezoelectric layer 12. As illustrated, the first layer 14-1 of the IDT electrode 14 can have a first side in physical contact with the piezoelectric layer 12 and a second side in physical contact with the second layer 14-2 of the IDT electrode 14. The second layer 14-2 of the IDT electrode 14 can be referred to as an upper electrode layer. The second layer 14-2 of the IDT electrode 14 can be disposed over the first layer 14-1 of the IDT electrode 14. As illustrated, the second layer 14-2 of the IDT electrode 14 can have a first side in physical contact with the first layer 14-1 of the IDT electrode 14. In some other embodiments, the first layer 14-1 and the second layer 14-2 can be switched.

The IDT electrode 14 can include any suitable material. For example, the first layer 14-1 can be tungsten (W) and the second layer 14-2 can be aluminum (Al) in certain embodiments. The IDT electrode 14 may include one or more other metals, such as copper (Cu), Magnesium (Mg), titanium (Ti), molybdenum (Mo), tantalum (Ta), gold (Au), etc. The IDT electrode 14 may include alloys, such as AlMgCu, AlCu, etc. In some embodiments, it can be beneficial to include a material that has a mass density that is greater than or equal to a mass density of molybdenum as the IDT electrode 14. For example, the IDT electrode 14 can include a material that has a mass density of 8.5 grams per cubic centimeter or more 10 grams per cubic centimeter or more, 10.1 grams per cubic centimeter or more, or 10.2 grams per cubic centimeter or more. For example, the material with a greater mass density can be tungsten, platinum, tantalum, or gold. Implementing the material with relatively high mass density can enable size reduction of the SAW device 2.

The first layer 14-1 has a height h1 and the second layer 14-2 has a height h2. In some embodiments, a thickness h1 of the first layer 14-1 can be in a range from 0.01 L to 0.075 L and a thickness h2 of the second layer 14-2 can be in a range from 0.05 L to 0.2 L. For example, when the wavelength L is 4 μm, the thickness h1 of the first layer 14-1 can be about 40 nm to 300 nm and the thickness h2 of the second layer 14-2 can be about 200 nm to 800 nm. Although the IDT electrode 14 has a dual-layer structure in the illustrated embodiments, any suitable principles and advantages disclosed herein can be applied to single layer IDT electrodes or multi-layer IDT electrodes that include three or more IDT layers. When the first layer 14-1 is a molybdenum (Mo) layer and the second layer 14-2 is an aluminum (Al) layer, the height h1 of the first layer 14-1 can be in a range of 0.02 L to 0.08 L, and the height h2 of the second layer 14-2 can be in a range of 0.04 L to 0.08 L. When the first layer 14-1 is a copper (Cu) layer and the second layer 14-2 is an aluminum (Al) layer, the height h1 of the first layer 14-1 can be in a range of 0.02 L to 0.08 L, and the height h2 of the second layer 14-2 can be in a range of 0.04 L to 0.08 L.

The IDT electrode 14 has an embedment depth $d_{embed}$ The embedment depth $d_{embed}$ in the piezoelectric layer 12 may be greater than 0 and equal to or less than 0.1 L, in some embodiments. The embedment depth $d_{embed}$ can be greater than 1% of the height h1 and less than the total thickness of the IDT electrode 14 (e.g., the sum of the heights h1, h2). For example, the embedment depth $d_{embed}$ can be in a range between 0.02 L and 0.08 L, 0.02 L and 0.06 L, 0.04 L and 0.08 L, or 0.04 L and 0.06 L.

Figure 2B:
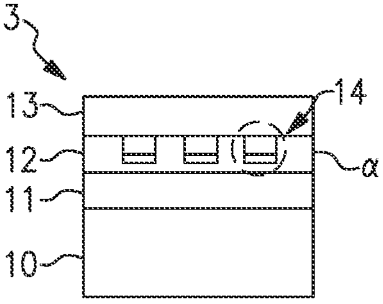
FIG. 2B is a cross sectional view of an IDT structure of a section of a SAW device with an IDT structure formed with a piezoelectric layer according to another embodiment.
Figure 2B:
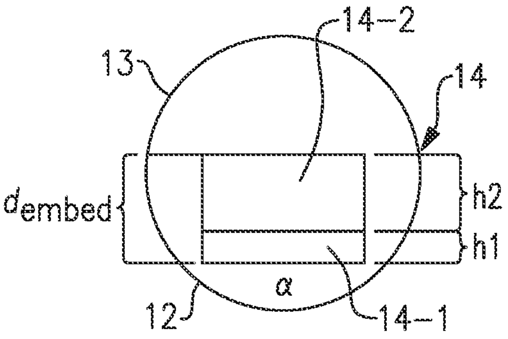

FIG. 2B is a cross sectional view of a SAW device 3 according to an embodiment. FIG. 2B' is an enlarged view of the encircled portion of the SAW device 3 shown in FIG. 2B. Unless otherwise noted, the components of the SAW device 3 may be structurally and/or functionally the same as or generally similar to like components of other SAW devices disclosed herein. The SAW device 3 can include a support substrate 10, a functional layer 11, a piezoelectric layer 12, a cover piezoelectric layer 13, and an interdigital transducer electrode 14.

The cover piezoelectric layer 13 can include the same or generally similar material as the piezoelectric layer 12. The cover piezoelectric layer 13 can be positioned over the IDT electrode 14 such that the IDT electrode 14 is positioned between the piezoelectric layer 12 and the cover piezoelectric layer 13. Capping the IDT electrode 14 with the cover piezoelectric layer 13 may increase a static capacitance which may be beneficial for size reduction.

The IDT electrode 14 can be fully embedded in the combination of the piezoelectric layer 12 and the cover piezoelectric layer 13. The piezoelectric layer 12 and the cover piezoelectric layer 13 can include, for example, 42±20° XY-$LiTaO_3$ or 42±25° XY-$LiTaO_3$. Alternatively or additionally, the piezoelectric layers 12 and 13 may comprise aXY-LT, or consist thereof, where a denotes the LT cut angle. The LT cut angle α may be in the range 0°≤a≤50°. The LT cut angles of the piezoelectric layers 12 and 13 may also be different.

The IDT electrode 14 of the SAW device 3 can include a first layer 14-1 and a second layer 14-2 as in the SAW device 2. For the fully embedded IDT structure shown in FIGS. 2B and 2B', the embedment depth $d_{embed}$ can be equal to the sum of the heights (h1+h2) of the first and second layers 14-1, 14-2.

Figure 2C:
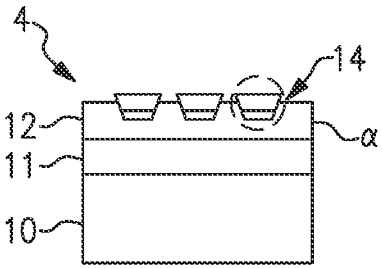
FIG. 2C is a cross sectional view of an IDT structure of a section of a SAW device with an IDT structure formed with a piezoelectric layer according to another embodiment.
Figure 2C:
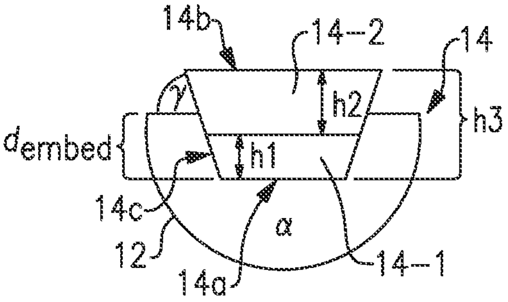

FIG. 2C is a cross sectional view of a SAW device 4 according to an embodiment. FIG. 2C' is an enlarged view of the encircled portion of the SAW device 4 shown in FIG. 2C. Unless otherwise noted, the components of the SAW device 4 may be structurally and/or functionally the same as or generally similar to like components of other SAW devices disclosed herein. The SAW device 4 can include a support substrate 10, a functional layer 11, a piezoelectric layer 12, and an interdigital transducer electrode 14.

A height h3 of the IDT electrode 14 (e.g., h1+h2) may be in the range of 0.06 L to 0.16 L. The embedment depth $d_{embed}$ may be in the range of 0.01 L to 0.16 L. The IDT electrode 14 may be fully embedded or formed in the piezoelectric layer 12, in some embodiments. Although the height h1 of the first layer 14-1 is illustrated to be smaller than the embedment depth $d_{embed}$, the height h1 of the first layer 14-1 may be greater than the embedment depth $d_{embed}$ in some embodiments.

The IDT electrode 14 has a first side 14*a*, a second side 14*b* opposite the first side 14*a*, and a sidewall 14*c* that extends between the first side 14*a* and the second side 14*b*. In some embodiments, the sidewall 14*c* can be tapered (e.g., not equal to 90°) relative to the first side 14*a* and/or the second side 14*b*. The IDT electrode 14 may have a taper angle γ between the sidewall 14*c* and the second side 14*b*. In certain designs, the taper angle γ between the sidewall 14*c* and the second side can be the same as or generally similar to an angle between the sidewall 14*c* and an upper surface of the piezoelectric layer 12 that faces away the support substrate 10. The taper angle γ may be in the range between 45° and 90°, 65° and 90°, 45° and 75°, or 70° and 80°.

The IDT electrodes 14 disclosed herein can be formed in any suitable manner. For example, a method of forming the IDT electrode 14 can include providing a piezoelectric material and removing at least a portion of the piezoelectric material to form a cavity. The method can include providing (e.g., depositing) a material of the IDT electrode 14 to at least partially fill the cavity. In some embodiments, providing the material of the IDT electrode 14 can include overfilling the cavity and removing an excess portion of the material of the IDT electrode 14. In some embodiments, such as those with a multilayer IDT structure, the IDT electrode 14 can be provided in multiple steps. For example, a first layer (e.g., the first layer 14-1) of the IDT electrode 14 can be provided first, and a second layer (e.g., the second layer 14-2) of the IDT electrode 14 can be provided after proving the first layer 14-1. A seed layer may be provided (e.g., deposited) before providing the IDT electrode 14. In some embodiments, additional piezoelectric material (e.g., the cover piezoelectric layer 13) can be provided over the IDT electrode 14.

While example SAW devices have been discussed with respect to 2A-2C', aspects described with respect to the devices of FIGS. 2A-2C' can apply to other types of acoustic wave devices, including boundary wave devices and Lamb wave devices. For example, boundary wave or Lamb wave devices can have layered structures in the similar or same arrangement of any of FIGS. 2A-2C' and can have interdigital transducers partially or fully formed in the piezoelectric layer.

FIG. 3A illustrates three plots of static coupling (left graph), $$k_{eff}^2$$

(middle graph), and resonance frequency $f_s$ (right graph) versus embedment depth $d_{embed}/\lambda$ for different heights $h_{Mo}$ of a Mo layer as the first layer 14-1 in the range of 0.02 L to 0.08 L, fixed height h Ai of an Al layer as the second layer 14-2 at 0.08 L, and fixed LT cut angle for XY-$LiTaO_3$ at 42°, as obtained from a 2D simulation for the IDT electrode 14 presented in FIG. 2A and FIG. 2A'.

The left graph of FIG. 3A indicates that embedding the IDT electrode 14 may lead to an increase of the static coupling of up to approximately 40% across the range of simulation. Hence, a size of the SAW device may be reduced. The left graph of FIG. 3A indicates that the overall thickness of the IDT electrode 14 has little to no significant effect on the static coupling because the static coupling is essentially independent of the different heights $h_{Mo}$ of the Mo layer used for the simulation. The middle graph of FIG. 3A indicates that embedding the IDT electrode 14 may lead to increase of $$k_{eff}^2$$

and thus to SAW device having an improved performance. A pass band filter may, for instance, be widened. The right graph of FIG. 3A indicates that embedding the IDT electrode 14 may lead to increased frequency (velocity) of up to approximately 12% the across range of simulation.

FIG. 3B illustrates three plots of static coupling (left graph), $$k_{eff}^2$$

(middle graph), and resonance frequency $f_s$ (right graph) versus embedment depth $d_{embed}/\lambda$ for different heights h Ai of an Al layer as the second layer 14-2 in the range of 0.04 L to 0.08 L, a fixed height $h_{Mo}$ of a Mo layer as the first layer 14-1 at 0.02 L, and fixed LT cut angle for XY-$LiTaO_3$ at 42°, as obtained from a 2D simulation for the IDT electrode 14 presented in FIG. 2A and FIG. 2A'.

The left graph of FIG. 3B indicates that embedding the IDT electrode 14 may lead to an increase of the static coupling of up to approximately 40% across the range of simulation. Hence, a size of the SAW device may be reduced. The left frame of FIG. 3B indicates that the overall thickness of the IDT structure has little to no significant effect on the static coupling because the static coupling is essentially independent of the different heights h Ai of the Al layer used for the simulation. The middle graph of FIG. 3B indicates that embedding the IDT structure may lead to increase of $$k_{eff}^2$$

and thus to SAW device having an increased performance for as long as a threshold for the overall thickness of the IDT structure is not exceeded (note the regions in which the trace for $h_{Al}/\lambda=0.08$ is lower than the trace for $h_{Al}/\lambda=0.06$). The right graph of FIG. 3B shows that embedding the IDT structure may lead to an increased frequency (velocity) where a thicker Al layer lowers the velocity. Hence, resistivity may be improved.

FIG. 3C illustrates a plot of the coupling coefficient $$k_{eff}^2$$

versus the LT cut angle for XY-$LiTaO_3$ for different embedment depths $d_{embed}$ in the range of 0 to 0.08 L, a fixed height $h_{Mo}$ of a Mo layer as the first layer 14-1 at 0.02 L, and a fixed height h Ai of an Al layer as the second layer 14-2 at 0.04 L, as obtained from a 2D simulation for the IDT electrode 14 presented in FIG. 2A and FIG. 2A'.

FIG. 3C indicates, with respect to an IDT electrode 14 positioned on a surface of the piezoelectric layer 12 (e.g., $d_{embed}=0$), $$k_{eff}^2$$

is increased when the IDT electrode 14 is at least partially positioned in the piezoelectric layer 12 in the range of simulation for an LT cut angle α greater than or equal to approximately 20°. FIG. 3C indicates that $$k_{eff}^2$$

above 13% was achieved for all simulated embedment depths for LT cut angles α greater than or equal to approximately 10° and less than or equal to approximately 35°, and for all simulated embedment depths other than 0 for LT cut angles α greater than or equal to approximately 10° and less than or equal to approximately 45°. Moreover, $$k_{eff}^2$$

above 14.0% was achieved for all simulated embedment depths for LT cut angles α greater than or equal to approximately 20° and less than or equal to approximately 25°, and for all simulated embedment depths other than 0 for LT cut angles α greater than or equal to approximately 20° and less than or equal to approximately 35°.

The simulation results shown in FIG. 3C indicate that a selection of at least the depth of the IDT electrode 14 in the piezoelectric layer 12 and/or the cut angle of the piezoelectric layer 12 can be significant for providing a SAW device with optimal performance. In some embodiments, it can be preferred to have the $d_{embed}$ in a range of 0.01 L to 0.1 L and to have an LT layer having a cut angle of 40±30° (40±30° Y-cut X-propagation LT) as the piezoelectric layer 12. For example, the depth $d_{embed}$ of the portion of the IDT electrode that is in the piezoelectric layer 12 in a range of 0.02 L to 0.1 L, 0.02 L to 0.8 L, 0.02 L to 0.6 L, 0.04 L to 0.1 L, or 0.04 L to 0.8 L. For example, the piezoelectric layer 12 can be an LT layer having a cut angle of 30±20°, 30±10°, or 20±10°.

FIG. 4A is a plot of admittance Y(dB) versus frequency f (GHz) for IDT structures with different embedment depths $d_{embed}/\lambda$ (no embedment, half embedded, and fully embedded) as obtained from a 3D simulation for the IDT electrode 14 in accordance with the structures shown in FIG. 2A and FIG. 2A'. FIG. 4B is a plot of conduction G(dB) versus frequency f (GHz) for IDT structures with different embedment depths $d_{embed}/\lambda$ (no embedment, half embedded, and fully embedded) as obtained from a 3D simulation for the IDT electrode 14 in accordance with the structures shown in FIG. 2A and FIG. 2A'. FIG. 4C is a plot of the quality factor Q versus frequency f (GHz) for IDT structures with different embedment depths $d_{embed}/\lambda$ (no embedment, half embedded, and fully embedded) as obtained from a 3D simulation for the IDT electrode 14 in accordance with the structures shown in FIG. 2A and FIG. 2A'. In the simulations of FIGS. 4A-4C, no embedment means that an entire portion of the IDT electrode 14 is positioned over a surface of the piezoelectric layer 12, half embedded means that the first layer 14-1 is positioned in the piezoelectric layer 12 and the second layer 14-2 is positioned over the piezoelectric layer 12, and fully embedded means that an entire portion of the IDT electrode 14 is positioned in the piezoelectric layer 12. Therefore, half embedded does not mean that a half of the IDT electrode 14 is positioned in the piezoelectric layer 12. Also, a surface of the IDT electrode 14 may be flush with the surface of the piezoelectric layer 12 and be exposed.

FIG. 4A to FIG. 4C indicate that, in combination with the 2D simulations shown in FIG. 3A to FIG. 3C, a half embedded IDT structure has a benefit in $$k_{eff}^2$$

and static capacitance. A fully embedded IDT structure degraded by radiation loss. A quality factor for a half embedded IDT structure is approximately the same as the quality factor without embedment.

FIG. 5A is a schematic cross-sectional side view of a surface acoustic wave (SAW) device 5 according to an embodiment. Unless otherwise noted, the components of the SAW device 5 may be structurally and/or functionally the same as or generally similar to like components of other SAW devices disclosed herein. The SAW device 5 can include a support substrate 10, a functional layer 11, a piezoelectric layer 12, and an interdigital transducer electrode 14.

In the SAW device 5, as with the SAW device 2 of FIGS. 2A and 2A', the IDT electrode 14 can be formed with and positioned at least partially in (e.g., embedded or buried) the piezoelectric layer 12. The IDT electrode 14 can include a first layer 14-1 and a second layer 14-2. The first layer 14-1 of the IDT electrode 14 can be referred to as a lower electrode layer. The first layer 14-1 of the IDT electrode 14 is disposed between the second layer 14-2 of the IDT electrode 14 and the piezoelectric layer 12. The second layer 14-2 of the IDT electrode 14 can be referred to as an upper electrode layer. The second layer 14-2 of the IDT electrode 14 can be disposed over the first layer 14-1 of the IDT electrode 14. Although the IDT electrode 14 has a dual-layer structure in the illustrated embodiments, any suitable principles and advantages disclosed herein can be applied to single layer IDT electrodes or multi-layer IDT electrodes that include three or more IDT layers.

In FIG. 5A, the first layer 14-1 is partially positioned (e.g., buried or embedded) in the piezoelectric layer 12. A portion of the first layer 14-1 that is positioned in the piezoelectric layer 12 has a height h1*b*, a portion of the first layer 14-1 that is positioned over an upper surface of the piezoelectric layer 12 has a height h1*t*, and the second layer 14-2 has a height h2. The portion of the first layer 14-1 that is positioned in the piezoelectric layer 12 has a sidewall that is angled relative to the upper surface of the piezoelectric layer 12 by an angle R, where the angle R is less than 90 degrees. For example, the angle R can be in a range between 89 degrees to 45 degrees, 95 degrees to 60 degrees, 80 degrees to 60 degrees, or 75 degrees to 65 degrees. The portion of the first layer 14-1 that is positioned over the upper surface of the piezoelectric layer 12 has a sidewall angled relative to the sidewall of the portion of the first layer 14-1 that is positioned in the piezoelectric layer 12.

The first layer 14-1 has a height h1 that includes the heights h1*b*, h1*t* and the second layer 14-2 has a height h2. In some embodiments, a sum of the heights h1*b*, h1*t* of the first layer 14-1 can be in a range from 0.01 L to 0.075 L and the thickness h2 of the second layer 14-2 can be in a range from 0.05 L to 0.2 L. In some embodiments, the height h1*b* can be in a range from 0.01 L to 0.06 L. The height h1*b* can be in a range of 1% to 99%, 5% to 90%, 10% to 80%, or 20% to 50% of the sum of the heights h1*b*, h1*t* of the first layer 14-1.

FIGS. 5B to 5D are graphs showing simulation results of four different SAW devices. One of the four SAW devices used in the simulations has a structure similar to the SAW device 1 of FIGS. 1A and 1B, and the other three SAW devices used in the simulations have a structure similar to the SAW device 5 of FIG. 5A. In the simulations, a tungsten layer is used as the first layer 14-1 of the IDT electrode 14 and an aluminum layer is used as the second layer 14-2 of the IDT electrode 14. The angle R of the sidewall used in the simulations is 70 degrees. Different materials and thicknesses h1*b*, h1*t*, h1, and h2 of the IDT electrode 14 are used in the simulations—(1) a molybdenum layer with the height h1 of 0.05 L is used as the first layer 14-1 and an aluminum layer with the height h2 of 0.05 L is used as the second layer 14-2; (2) a tungsten layer with the height h1*b* of 0.02 L and the height h1*t* of 0.02 L is used as the first layer 14-1 and an aluminum layer with the height h2 of 0.04 L is used as the second layer 14-2; (3) a tungsten layer with the height h1*b* of 0.04 L and the height h1*t* of 0.02 L is used as the first layer 14-1 and an aluminum layer with the height h2 of 0.04 L is used as the second layer 14-2; (4) a tungsten layer with the height h1*b* of 0.06 L and the height h1*t* of 0.02 L is used as the first layer 14-1 and an aluminum layer with the height h2 of 0.04 L is used as the second layer 14-2

The simulation results of FIGS. 5B-5D indicate that the use of tungsten as the first layer 14-1 can significantly reduce the velocity as compared to molybdenum, which can enable size reduction of the SAW device 5. Also, when the thickness h1 of the first layer 14-1 (the tungsten layer) is increased, the velocity can be further reduced.

FIGS. 6A to 6C are graphs showing simulation results of four different SAW devices. The SAW devices used in the simulations of FIGS. 6A-6C are similar to the SAW devices used in the simulations of FIGS. 5B-5D, except the height h1*t* of the SAW devices (2), (3), (4) are fixed to 0.04 L instead of 0.02 L. The simulation results of FIGS. 6A to 6C indicate that when the thickness h1 of the first layer 14-1 (the tungsten layer) is further increased, the velocity can be further reduced.

It can be beneficial to include a material that has a relatively high mass density, such as a mass density that is greater than or equal to a mass density of molybdenum, as the IDT electrode 14 for size reduction. For example, the IDT electrode can include a material that has a mass density of 8.5 grams per cubic centimeter or more 10 grams per cubic centimeter or more, 10.1 grams per cubic centimeter or more, or 10.2 grams per cubic centimeter or more. For example, a material with a relatively high mass density can be tungsten, platinum, tantalum, or gold. The use of the relatively high mass density material as a layer (e.g., the first layer 14-1) in the IDT electrode 14, and another material as a different layer (e.g., the second layer 14-1) in the IDT electrode 14 with the thicknesses of the layers as disclosed herein can provide a reduced-size SAW device with a high coupling coefficient $k_{eff}^2$ and a high quality factor Q.

FIGS. 7A to 7D are schematic cross-sectional side views illustrating different shapes of an interdigital transducer (IDT) electrode 14. Any suitable principles and advantages disclosed herein can be implemented with the IDT electrode 14 illustrated in FIGS. 7A-7D.

Figure 7A:
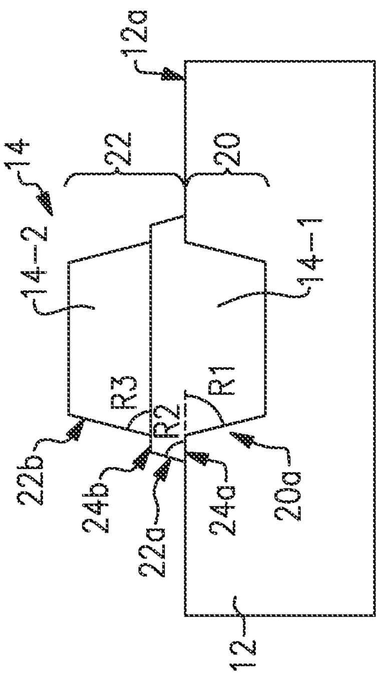

Referring to FIG. 7A, the IDT electrode 14 can include a first layer 14-1 and a second layer 14-2. The IDT electrode 14 also includes a first portion 20 that is positioned (e.g., buried or embedded) in the piezoelectric layer 12, and a second portion 22 that is positioned over a surface 12*a* of the piezoelectric layer 12. The first portion 20 of the IDT electrode 14 has a sidewall 20*a*, and the second portion 22 has a sidewall 22*a* and a sidewall 22*b*. As illustrated, the sidewall 22*a* can be a portion of the first layer 14-1 and the sidewall 22*b* can be a portion of the second layer 14-2.

The sidewall 20*a* of the first portion 20 is angled relative to the surface 12*a* of the piezoelectric layer 12 by an angle R1, where the angle R1 is less than 90 degrees. For example, the angle R1 can be in a range between 89 degrees to 45 degrees, 95 degrees to 60 degrees, 80 degrees to 60 degrees, or 75 degrees to 65 degrees. The sidewall 20*a* can be tapered or angled such that a lower side of the first portion 20 has a narrower width than an upper side of the first portion 20 closer to the surface 12*a* of the piezoelectric layer 12.

The sidewalls 22*a*, 22*b* of the second portion 22 are angled relative to the surface 12*a* of the piezoelectric layer 12 by an angle R2, R3. For example, the angle R2 can be in a range between 89 degrees to 45 degrees, 95 degrees to 60 degrees, 80 degrees to 60 degrees, or 75 degrees to 65 degrees. For example, the angle R3 can be in a range between 89 degrees to 45 degrees, 95 degrees to 60 degrees, 80 degrees to 60 degrees, or 75 degrees to 65 degrees. The sidewalls 22*a*, 22*b* can be tapered or angled such that a lower side of the second portion 22 has a wider width than an upper side of the second portion 22 farther away from the surface 12*a* of the piezoelectric layer 12.

The sidewall 20*a* of the first portion 20 can be angled relative to the sidewall 22*a* and/or the sidewall 22*b* of the second portion 22 (e.g., R1+R2≠180 or R1+R3≠180). For example, the sidewall 20*a* and the sidewall 22*a* can be angled in a range between 5 degrees and 90 degrees, 5 degrees and 60 degrees, 10 degrees to 60 degrees, 10 degrees to 50 degrees, or 20 degrees to 40 degrees such that the sum of the angles R1+R2 be in a range between 90 degrees to 175 degrees, 120 degrees to 175 degrees, 130 degrees to 170 degrees or 140 degrees to 160 degrees. Similarly, the sidewall 20*a* and the sidewall 22*b* can be angled in a range between 5 degrees and 90 degrees, 5 degrees and 60 degrees, 10 degrees to 60 degrees, 10 degrees to 50 degrees, or 20 degrees to 40 degrees such that the sum of the angles R1+R3 be in a range between 90 degrees to 175 degrees, 120 degrees to 175 degrees, 130 degrees to 170 degrees or 140 degrees to 160 degrees. The sidewall 20*a* and the sidewall 22*a* can be laterally offset by a gap 24*a*, and the sidewall 22*a* and the sidewall 22*b* can be laterally offset by a gap 24*b*. The gaps 24*a*, 24*b* can be an indication of different etching and deposition processes for forming the IDT electrode 14.

Figure 7B:
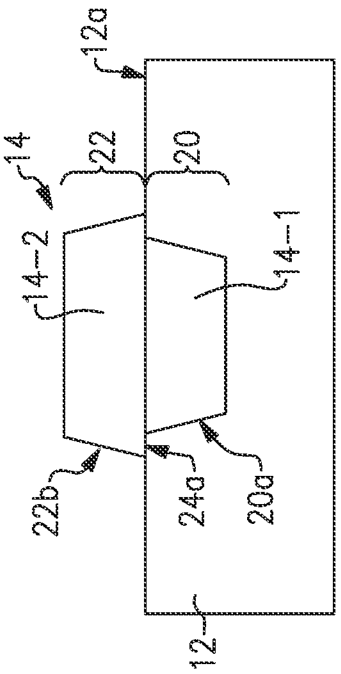

Referring to FIG. 7B, in some embodiments, the second portion 22 can consist of the second layer 14-2. When the IDT electrode 14 has a single layer structure, the first portion 20 and the second portion 22 can have the same material. As with the embodiment shown in FIG. 7A, the first portion 20 has the sidewall 20*a* and the second portion 22 has the sidewall 22*b*. In the illustrated embodiment of FIG. 7B, the width of the first portion 20 at the surface 12*a* of the piezoelectric layer 12 is narrower than the width of the second portion 22 at the surface of the 12*a* of the piezoelectric layer 12.

Figure 7C:
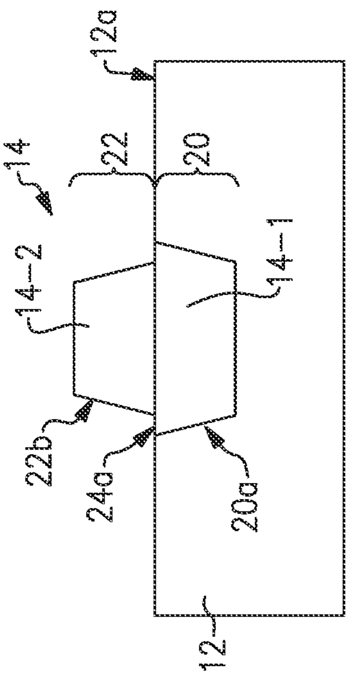

FIG. 7C shows that the width of the first portion 20 at the surface 12*a* of the piezoelectric layer 12 can be wider than the width of the second portion 22 at the surface of the 12*a* of the piezoelectric layer 12. The sidewalls 20*a* and 22*b* can be angled from one another and/or laterally offset by the gap 24*a*.

Figure 7D:
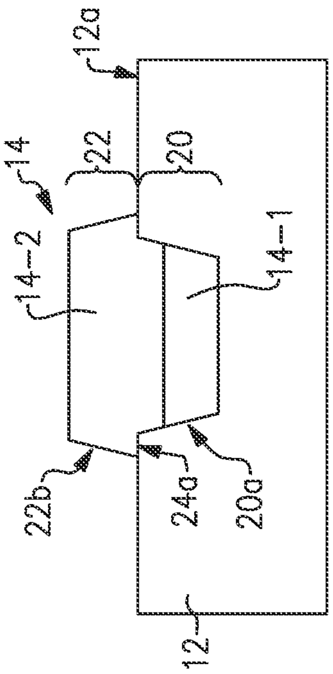

Referring to FIG. 7D, the first portion 20 of the IDT electrode 14 can include the first layer 14-1 and a portion of the second layer 14-2. As with that shown in FIG. 7A, the sidewall 20*a* of the first portion 20 can be angled relative to the sidewall 22*b* of the second portion 22. Also, the sidewall 20*a* and the sidewall 22*b* can be laterally offset by a gap 24*a*.

Although a dual layer structure of the IDT electrode 14 is illustrated as examples in FIGS. 7A-7D, generally similar or the same shapes of the IDT electrode can be implemented with a single layer IDT electrode or a multilayer IDT electrode that includes three more layers.

FIG. 8A is a schematic diagram of a ladder filter 50 according to an embodiment. The ladder filter 50 includes shunt BAW resonators 52 and series SAW resonators 54 coupled between RF input/output ports Port1 and Port2. The ladder filter 50 is an example topology of a band pass filter formed from acoustic resonators. In a band pass filter with a ladder filter topology, the shunt resonators can have lower resonant frequencies than the series resonators. The ladder filter 50 can be arranged to filter an RF signal. As illustrated, the shunt BAW resonators include resonators R1, R3, R5, R7, and R9. The illustrated series SAW resonators 54 include resonators R2, R4, R6, R8, and R10. In particular, the TCSAW resonators 54 may be formed with features of any one or more of the IDT electrodes disclosed herein. The first RF input/output port Port1 can be a transmit port for a transmit filter or a receive port for a receive filter. The second RF input/output port Port2 can be an antenna port. Any suitable number of series acoustic resonators can be included in a ladder filter. Any suitable number of shunt acoustic wave resonators can be included in a ladder filter.

FIG. 8B is a schematic diagram of a ladder filter 60 according to another embodiment. The ladder filter 60 includes a plurality of acoustic resonators R1, R2, . . . , RN-1, and RN arranged between a first input/output port PORT1 and a second input/output port PORT1. One of the input/output ports PORT1 or PORT2 can be an antenna port. In certain instances, the other of the input/output ports PORT1 or PORT2 can be a receive port. In some other instances, the other of the input/output ports PORT1 or PORT2 can be a transmit port.

The ladder filter 60 illustrates that any suable number of ladder stages can be implemented in a ladder filter in accordance with any suitable principles and advantages disclosed herein. Ladder stages can start with a series resonator or a shunt resonator from any input/output port of the ladder filter 60 as suitable. As illustrated, the first ladder stage from the input/output port PORT1 begins with a shunt resonator R1. As also illustrated, the first ladder stage from the input/output port PORT2 begins with a series resonator RN.

The ladder filter 60 includes shunt resonators R1 and RN-1 and series resonator R2 and RN. The series resonators of the ladder filter 60 including resonators R2 and RN can be acoustic resonators of a first type that have higher Q than series resonators of a second type in a frequency range below fs. The shunt resonators of the ladder filter 60 including resonators R1 and RN-1 can be acoustic resonators of the second type and have higher Q than shunt resonators of the first type in a frequency range between fs and fp. This can lead to a reduced insertion loss. The ladder filter 60 can be a band pass filter with series resonators of the first type and shunt resonators of the second type. In some other embodiments, the series resonators of the ladder filter 60 including resonators R2 and RN can be acoustic resonators of the second type and the shunt resonators of the ladder filter 60 including resonators R1 and RN-1 can be acoustic resonators of the first type. In such embodiments, the ladder filter 60 can be a band pass filter.

The resonators of the first type can be SAW resonators and the resonators of the second type can be BAW resonators. Accordingly, the ladder filter 60 can include series SAW resonators and shunt BAW resonators in certain embodiments. Such BAW resonators can include FBARs and/or solidly mounted resonators (SMRs). In particular, the SAW resonators of the ladder filter 60 may be formed with features of any one or more of the IDT electrodes disclosed herein.

The resonators of the first type can be multi-layer piezoelectric substrate (MPS) SAW resonators and the resonators of the second type can be BAW resonators. Accordingly, the ladder filter 60 can include series MPS SAW resonators and shunt BAW resonators. Such BAW resonators can include FBARs and/or SMRs in certain embodiments.

In a bandpass filter with a ladder filter topology, such as the acoustic wave filter 60, the shunt resonators can have lower resonant frequencies than the series resonators. In certain embodiments, the shunt resonators of the acoustic wave filter 60 are BAW resonators and the series resonators of the acoustic wave filter 60 are SAW resonators. In such embodiments, the acoustic wave filter 60 can be a band pass filter. Such a bandpass filter can achieve low insertion loss at both a lower band edge and an upper band edge of a passband.

In a band stop filter with a ladder filter topology, such as acoustic wave filter 60, the shunt resonators can have higher resonant frequencies than the series resonators. In certain embodiments, the acoustic wave filter 60 is a band stop filter, the shunt resonators of the acoustic wave filter 60 are SAW resonators and the series resonators of the acoustic wave filter 60 are BAW resonators. Such a band stop filter can achieve desirable characteristics in a stop band of the band stop filter.

In some applications of an acoustic wave filter that includes SAW series resonators and BAW shunt resonators, such as a transmit filter with a relatively high power handling specification, one or more series resonators close to a transmit port (or the lower frequency series resonators) can be BAW resonators to help with ruggedness.

In certain applications, the ladder filter 60 can be included in a multiplexer in which relatively high γ for the ladder filter 60 in one or more higher frequency carrier aggregation bands is desired. In such applications, an acoustic filter can include shunt resonators of the shunt type and an acoustic resonator of the second type can be included as a series resonator by which other series resonators of the first type are coupled to a common port of the multiplexer. This can increase γ of the ladder filter 60 in the one or more higher frequency carrier aggregation bands. For example, in applications where the second input/output port PORT2 is a common port of a multiplexer, the series resonator RN can be a BAW resonator, other series resonators of the ladder filter 60 can be SAW resonators, and the shunt resonators R1 and RN-1 can be BAW resonators. By having the series resonator RN closest to the common node be a BAW resonator instead of a SAW resonator, γ can be increased for the ladder filter 60 in one or more higher frequency carrier aggregation bands in such applications.

In some applications, the ladder filter 60 can be a transmit filter. In such applications, an acoustic resonator of the second type can be included as a series resonator by which other series resonators of the first type are coupled to a transmit port of the transmit filter. For example, in applications where the second input/output port PORT2 is a transmit port of a transmit filter, the series resonator RN can be a BAW resonator, other series resonators of the ladder filter 60 can be SAW resonators, and the shunt resonators R1 and RN-1 can be BAW resonators.

In certain applications, the ladder filter 60 can include more than two types of acoustic resonators. In such applications, the majority of the series resonators can be acoustic resonators of the first type (e.g., SAW resonators) and the majority of shunt resonators can be resonators of the second type (e.g., BAW resonators). The ladder filter 60 can include a third type of resonator as a shunt resonator and/or as a series resonator in such applications. The third type of resonator can be a Lamb wave resonator, for example. The acoustic wave filter 60 can include a plurality series resonators including temperature compensated surface acoustic wave resonators and a plurality shunt resonators including a Lamb wave resonator arranged as shunt resonator. The acoustic wave filter 60 can include a plurality of series resonators including a Lamb wave resonator and a plurality shunt resonators including bulk acoustic wave resonators arranged as shunt resonators.

FIG. 9A is a schematic diagram of a lattice filter 70. The lattice filter 70 is an example topology of a band pass filter formed from acoustic wave resonators. The lattice filter 60 can be arranged to filter an RF signal. As illustrated, the lattice filter 70 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 70 has a balanced input and a balanced output. The lattice filter 70 can be implemented with different type of acoustic resonators in accordance with any suitable principles and advantages disclosed herein. For example, the series resonators RL1 and RL2 can be SAW resonators and the shunt resonators RL3 and RL4 can be BAW resonators for a bandpass filter. In particular, the SAW resonators may be formed with features of any one or more of the IDT electrodes disclosed herein.

FIG. 9B is a schematic diagram of a hybrid ladder and lattice filter 80. The illustrated hybrid ladder and lattice filter includes series acoustic resonators RL1, RL2, RH3, and RH4 and shunt acoustic resonators RL3, RL4, RH1, and RH2. The hybrid ladder and lattice filter 80 can be implemented with different type of acoustic resonators in accordance with any suitable principles and advantages disclosed herein. For example, the series resonators RL1, RL2, RH3, and RH4 can be SAW resonators and the shunt resonators RL3, RL4, RH1, and RH2 can be BAW resonators for a bandpass filter. In particular, the SAW resonators may be formed with features of any one or more of the IDT electrodes disclosed herein.

FIG. 9C is a schematic diagram of an acoustic filter 91 that includes ladder stages and a multi-mode surface acoustic wave filter 92. The illustrated acoustic filter 91 includes series resonators R2 and R4, shunt resonators R1 and R3, and multi-mode surface acoustic wave filter 92. The filter 91 can be a receive filter. The multi-mode surface acoustic wave filter 92 can be connected to a receive port. The multi-mode surface acoustic wave filter 92 includes longitudinally coupled IDT electrodes. The multi-mode surface acoustic wave filter 92 can include a temperature compensation layer over longitudinally coupled IDT electrodes in certain applications. The series resonators R2 and R4 can be SAW resonators and the shunt resonators R1 and R3 can be BAW resonators for a bandpass filter. The shunt resonators R1 and R3 being BAW resonators can help with lower skirt steepness and insertion loss. In particular, the SAW resonators may be formed with features of any one or more of the IDT electrodes disclosed herein.

Acoustic filters disclosed herein include more than one type of acoustic wave resonator. Such filters can be implemented on a plurality of acoustic filter die. The plurality of acoustic filter die can be stacked and co-packaged with each other in certain applications.

FIG. 10A is a schematic diagram of a duplexer 100 that includes an acoustic wave filter according to an embodiment. The duplexer 100 includes a first filter 102 and a second filter 104 coupled to together at a common node COM. One of the filters of the duplexer 100 can be a transmit filter and the other of the filters of the duplexer 100 can be a receive filter. The transmit filter and/or the receive filter can be respective ladder filters with acoustic wave resonators having a topology similar to the ladder filter 50 and the ladder filter 60. In some other instances, such as in a diversity receive application, the duplexer 100 can include two receive filters. The common node COM can be an antenna node.

The first filter 102 is an acoustic wave filter arranged to filter a radio frequency signal. The first filter 102 can include acoustic wave resonators coupled between a first radio frequency node RF1 and the common node. The first radio frequency node RF1 can be a transmit node or a receive node. The first filter 102 includes two types of acoustic resonators in accordance with any suitable principles and advantages disclosed herein.

The second filter 104 can be any suitable filter arranged to filter a second radio frequency signal. The second filter 104 can be, for example, an acoustic wave filter, an acoustic wave filter that includes two types of acoustic resonators, an LC filter, a hybrid acoustic wave LC filter, or the like. The second filter 104 is coupled between a second radio frequency node RF2 and the common node. The second radio frequency node RF2 can be a transmit node or a receive node.

Although example embodiments may be discussed with filters or duplexers for illustrative purposes, any suitable the principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. One or more filters of a multiplexer can include an acoustic wave filter including two types of acoustic resonators in accordance with any suitable principles and advantages disclosed herein.

FIG. 10B is a schematic diagram of a multiplexer 105 that includes an acoustic wave filter according to an embodiment. The multiplexer 105 includes a plurality of filters 102 to 106 coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters.

The first filter 102 is an acoustic wave filter arranged to filter a radio frequency signal. The first filter 102 can include acoustic wave resonators coupled between a first radio frequency node RF1 and the common node. The first radio frequency node RF1 can be a transmit node or a receive node. The first filter 102 includes two types of acoustic resonators in accordance with any suitable principles and advantages disclosed herein. The other filter(s) of the multiplexer 105 can include one or more acoustic wave filters, one or more acoustic wave filters that include two types of acoustic resonators in accordance with any suitable principles and advantages disclosed herein, one or more LC filters, one or more hybrid acoustic wave LC filters, or any suitable combination thereof.

The acoustic wave filters disclosed herein can be implemented in a variety of packaged modules. In particular, acoustic wave filters disclosed herein may be formed with features of any one or more of the IDT electrodes disclosed herein. Some example packaged modules will now be disclosed in which any suitable principles and advantages of the acoustic wave filters and/or acoustic wave resonators disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 11 to 15 are schematic block diagrams of illustrative packaged modules according to certain embodiments. Any suitable combination of features of these packaged modules can be implemented with each other. While duplexers are illustrated in the example packaged modules, any other suitable multiplexer that includes a plurality of filters coupled to a common node and/or standalone filter can be implemented instead of one or more duplexers. For example, a triplexer can be implemented in certain applications. As another example, one or more filters of a packaged module can be arranged as a transmit filter or a receive filter that is not included in a multiplexer.

FIG. 11 is a schematic diagram of a radio frequency module 200 that includes an acoustic wave component 202 according to an embodiment. The illustrated radio frequency module 200 includes the acoustic wave component 202 and other circuitry 203. The acoustic wave component 202 can include one or more acoustic wave filters in accordance with any suitable combination of features of the acoustic wave filters disclosed herein. The acoustic wave component 202 can include an acoustic wave filter with series SAW resonators and shunt BAW resonators, for example.

The acoustic wave component 202 shown in FIG. 11 includes one or more acoustic wave filters 204 and terminals 205A and 205B. The one or more acoustic wave filters 204 includes an acoustic wave filter implemented in accordance with any suitable principles and advantages disclosed herein. The terminals 205A and 204B can serve, for example, as an input contact and an output contact. Although two terminals are illustrated, any suitable number of terminals can be implemented for a particular application. The acoustic wave component 202 and the other circuitry 203 are on a common packaging substrate 206 in FIG. 11. The package substrate 206 can be a laminate substrate. The terminals 205A and 205B can be electrically connected to contacts 207A and 207B, respectively, on the packaging substrate 206 by way of electrical connectors 208A and 208B, respectively. The electrical connectors 208A and 208B can be bumps or wire bonds, for example.

The other circuitry 203 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. The other circuitry 203 can be electrically connected to the one or more acoustic wave filters 204. The radio frequency module 200 can include one or more packaging structures to, for example, provide protection and/or facilitate easier handling of the radio frequency module 200. Such a packaging structure can include an overmold structure formed over the packaging substrate 206. The overmold structure can encapsulate some or all of the components of the radio frequency module 200.

FIG. 12 is a schematic block diagram of a module 210 that includes duplexers 211A to 211N and an antenna switch 212. One or more filters of the duplexers 211A to 211N can include an acoustic wave filter in accordance with any suitable principles and advantages disclosed herein. Any suitable number of duplexers 211A to 211N can be implemented. The antenna switch 212 can have a number of throws corresponding to the number of duplexers 211A to 211N. The antenna switch 212 can include one or more additional throws coupled to one or more filters external to the module 210 and/or coupled to other circuitry. The antenna switch 212 can electrically couple a selected duplexer to an antenna port of the module 210.

FIG. 13 is a schematic block diagram of a module 220 that includes a power amplifier 222, a radio frequency switch 224, and duplexers 211A to 211N according to an embodiment. The power amplifier 222 can amplify a radio frequency signal. The radio frequency switch 224 can be a multi-throw radio frequency switch. The radio frequency switch 224 can electrically couple an output of the power amplifier 222 to a selected transmit filter of the duplexers 211A to 211N. One or more filters of the duplexers 211A to 211N can be an acoustic wave filter in accordance with any suitable principles and advantages disclosed herein. Any suitable number of duplexers 211A to 211N can be implemented.

FIG. 14 is a schematic block diagram of a module 230 that includes filters 232A to 232N, a radio frequency switch 234, and a low noise amplifier 236 according to an embodiment. One or more filters of the filters 232A to 232N can include any suitable number of acoustic wave filters in accordance with any suitable principles and advantages disclosed herein. Any suitable number of filters 232A to 232N can be implemented. The illustrated filters 232A to 232N are receive filters. In some embodiments (not illustrated), one or more of the filters 232A to 232N can be included in a multiplexer that also includes a transmit filter. The radio frequency switch 234 can be a multi-throw radio frequency switch. The radio frequency switch 234 can electrically couple an output of a selected filter of filters 232A to 232N to the low noise amplifier 236. In some embodiments (not illustrated), a plurality of low noise amplifiers can be implemented. The module 230 can include diversity receive features in certain applications.

FIG. 15 is a schematic diagram of a radio frequency module 240 that includes an acoustic wave filter according to an embodiment. As illustrated, the radio frequency module 240 includes duplexers 211A to 211N, a power amplifier 222, a select switch 224, and an antenna switch 212. The radio frequency module 240 can include a package that encloses the illustrated elements. The illustrated elements can be disposed on a common packaging substrate 247. The packaging substrate 247 can be a laminate substrate, for example. A radio frequency module that includes a power amplifier can be referred to as a power amplifier module. A radio frequency module can include a subset of the elements illustrated in FIG. 15 and/or additional elements. The radio frequency module 240 may include any one of the acoustic wave filters in accordance with any suitable principles and advantages disclosed herein.

The duplexers 211A to 211N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can include an acoustic wave filter in accordance with any suitable principles and advantages disclosed herein. Similarly, one or more of the receive filters can include an acoustic wave filter in accordance with any suitable principles and advantages disclosed herein. Although FIG. 15 illustrates duplexers, any suitable principles and advantages disclosed herein can be implemented in other multiplexers (e.g., quadplexers, hexaplexers, octoplexers, etc.) and/or in switch-plexers and/or with standalone filters.

The power amplifier 222 can amplify a radio frequency signal. The illustrated switch 224 is a multi-throw radio frequency switch. The switch 224 can electrically couple an output of the power amplifier 222 to a selected transmit filter of the transmit filters of the duplexers 211A to 211N. In some instances, the switch 224 can electrically connect the output of the power amplifier 222 to more than one of the transmit filters. The antenna switch 212 can selectively couple a signal from one or more of the duplexers 211A to 211N to an antenna port ANT. The duplexers 211A to 211N can be associated with different frequency bands and/or different modes of operation (e.g., different power modes, different signaling modes, etc.).

The acoustic wave filters disclosed herein can be implemented in a variety of wireless communication devices. FIG. 16A is a schematic diagram of a wireless communication device 250 that includes filters 253 in a radio frequency front end 252 according to an embodiment. One or more of the filters 253 can be acoustic wave filter in accordance with any suitable principles and advantages disclosed herein. The wireless communication device 250 can be any suitable wireless communication device. For instance, a wireless communication device 250 can be a mobile phone, such as a smart phone. As illustrated, the wireless communication device 250 includes an antenna 251, an RF front end 252, a transceiver 254, a processor 255, a memory 256, and a user interface 257. The antenna 251 can transmit RF signals provided by the RF front end 252. Such RF signals can include carrier aggregation signals. The antenna 251 can receive RF signals and provide the received RF signals to the RF front end 252 for processing. Such RF signals can include carrier aggregation signals. The wireless communication device 250 can include two or more antennas in certain instances.

The RF front end 252 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 252 can transmit and receive RF signals associated with any suitable communication standards. One or more of the filters 253 can include an acoustic wave filter with two types of acoustic resonators that includes any suitable combination of features of the embodiments disclosed above.

The transceiver 254 can provide RF signals to the RF front end 252 for amplification and/or other processing. The transceiver 254 can also process an RF signal provided by a low noise amplifier of the RF front end 252. The transceiver 254 is in communication with the processor 255. The processor 255 can be a baseband processor. The processor 255 can provide any suitable base band processing functions for the wireless communication device 250. The memory 256 can be accessed by the processor 255. The memory 256 can store any suitable data for the wireless communication device 250. The user interface 257 can be any suitable user interface, such as a display with touch screen capabilities.

FIG. 16B is a schematic diagram of a wireless communication device 260 that includes filters 253 in a radio frequency front end 252 and second filters 263 in a diversity receive module 262. The wireless communication device 260 is like the wireless communication device 250 of FIG. 16A, except that the wireless communication device 260 also includes diversity receive features. As illustrated in FIG. 16B, the wireless communication device 260 includes a diversity antenna 261, a diversity module 262 configured to process signals received by the diversity antenna 261 and including filters 263, and a transceiver 254 in communication with both the radio frequency front end 252 and the diversity receive module 262. One or more of the second filters 263 can include an acoustic wave filter in accordance with any suitable principles and advantages disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz.

An acoustic wave filter including any suitable combination of features disclosed herein be arranged to filter a radio frequency signal in a 5G NR operating band within Frequency Range 1 (FR1). A filter arranged to filter a radio frequency signal in a 5G NR operating band can include two types of acoustic resonators in accordance with any principles and advantages disclosed herein. FR1 can be from 410 MHz to 7.125 GHz, for example, as specified in a current 5G NR specification. In 5G applications, an acoustic wave filter with a relatively wide pass band and relatively low insertion loss can be advantageous for implementing dual connectivity. An acoustic wave filter in accordance with any suitable principles and advantages disclosed herein can be arranged to filter a radio frequency signal in a 4G LTE operating band and/or in a filter having a passband that includes a 4G LTE operating band and a 5G NR operating band. Filters disclosed herein can filter radio frequency signals in a frequency range from about 400 MHz to 3 GHz in certain applications.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A surface acoustic wave device comprising:

a multilayer piezoelectric substrate having a support substrate and a piezoelectric layer over the support substrate; and an interdigital transducer electrode having a first layer and a second layer including different materials, the first layer including a material that has a mass density greater than or equal to a mass density of molybdenum, the interdigital transducer electrode including a top portion above a top surface of the piezoelectric layer and a bottom portion within a cavity formed in the piezoelectric layer, a periphery of the top portion formed from the second layer and extending beyond the cavity and onto the top surface of the piezoelectric layer, the first layer completely positioned in the cavity of the piezoelectric layer and the second layer partially positioned in the cavity of the piezoelectric layer and partially positioned over the piezoelectric layer.

2. The surface acoustic wave device of claim 1 wherein the piezoelectric layer includes lithium tantalate.

3. The surface acoustic wave device of claim 2 wherein the piezoelectric layer is a 40±30° Y-cut X-propagation lithium tantalate layer.

4. The surface acoustic wave device of claim 1 wherein the first layer includes tungsten.

5. The surface acoustic wave device of claim 4 wherein the second layer includes aluminum.

6. The surface acoustic wave device of claim 1 wherein a depth of the interdigital transducer electrode positioned in the piezoelectric layer is in a range between 0.02L and 0.08L, L being a wavelength of a surface acoustic wave generated by the surface acoustic wave device.

7. The surface acoustic wave device of claim 1 wherein a thickness of the first layer is in a range between 0.02L and 0.08L, L being a wavelength of a surface acoustic wave generated by the surface acoustic wave device.

8. A surface acoustic wave device comprising:

a multilayer piezoelectric substrate having a support substrate and a piezoelectric layer over the support substrate, the piezoelectric layer having a first surface facing the support substrate and a second surface opposite the first surface; and an interdigital transducer electrode having a top portion above the second surface of the piezoelectric layer and a bottom portion within a cavity formed in the piezoelectric layer, the interdigital transducer electrode having a first layer and a second layer including different materials, the first layer including a material that has a mass density greater than 10 grams per cubic centimeter, the first layer completely positioned in the cavity of the piezoelectric layer, the second layer partially positioned in the cavity of the piezoelectric layer and partially positioned over the piezoelectric layer, and a periphery of the top portion formed from the second layer and extending beyond the cavity and onto the second surface of the piezoelectric layer.

9. The surface acoustic wave device of claim 8 wherein the piezoelectric layer is a 40±30° Y-cut X-propagation lithium tantalate layer.

10. The surface acoustic wave device of claim 8 wherein the first layer includes tungsten.

11. The surface acoustic wave device of claim 8 wherein the second layer includes aluminum.

12. The surface acoustic wave device of claim 8 wherein the first layer is partially positioned in the piezoelectric layer and the first layer is positioned over the piezoelectric layer.

13. The surface acoustic wave device of claim 8 wherein the first layer is completely positioned in the piezoelectric layer and the first layer is positioned over the piezoelectric layer.

14. The surface acoustic wave device of claim 8 wherein a depth of the interdigital transducer electrode positioned in the piezoelectric layer is in a range between 0.02L and 0.08L, L being a wavelength of a surface acoustic wave generated by the surface acoustic wave device.

15. The surface acoustic wave device of claim 8 wherein a thickness of the first layer is in a range between 0.02L and 0.08L, L being a wavelength of a surface acoustic wave generated by the surface acoustic wave device.

16. A surface acoustic wave device comprising:

a multilayer piezoelectric substrate having a support substrate and a piezoelectric layer over the support substrate, the piezoelectric layer having a cavity; and an interdigital transducer electrode including a top portion above a top surface of the piezoelectric layer and a bottom portion within the cavity, the interdigital transducer electrode having a first layer and a second layer including different materials, the first layer including a material that has a mass density greater than or equal to a mass density of molybdenum, the first layer completely positioned in the cavity of the piezoelectric layer, the second layer partially positioned in the cavity of the piezoelectric layer and partially positioned over the piezoelectric layer, and a periphery of the top portion formed from the second layer and extending beyond the cavity and onto the top surface of the piezoelectric layer.

17. The surface acoustic wave device of claim 16 wherein the piezoelectric layer is a 40±30° Y-cut X-propagation lithium tantalate layer.

18. The surface acoustic wave device of claim 16 wherein the first layer includes tungsten.

19. The surface acoustic wave device of claim 16 wherein the second layer includes aluminum.

20. The surface acoustic wave device of claim 16 wherein a depth of the interdigital transducer electrode positioned in the piezoelectric layer is in a range between 0.02L and 0.08L, L being a wavelength of a surface acoustic wave generated by the surface acoustic wave device.

* * * * *